United States Patent
Takahashi et al.

(10) Patent No.: US 6,809,989 B2
(45) Date of Patent: Oct. 26, 2004

(54) SEMICONDUCTOR STORAGE DEVICE

(75) Inventors: Hiroyuki Takahashi, Tokyo (JP); Masatoshi Sonoda, Tokyo (JP)

(73) Assignee: NEC Electronics Corporation, Kanagawa (JP)

( * ) Notice: Subject to any disclaimer, the term of this patent is extended or adjusted under 35 U.S.C. 154(b) by 1 day.

(21) Appl. No.: 10/258,334

(22) PCT Filed: Apr. 12, 2001

(86) PCT No.: PCT/JP01/03156

§ 371 (c)(1),
(2), (4) Date: Oct. 21, 2002

(87) PCT Pub. No.: WO01/82304

PCT Pub. Date: Nov. 1, 2001

(65) Prior Publication Data

US 2003/0112668 A1 Jun. 19, 2003

(30) Foreign Application Priority Data

Apr. 24, 2000 (JP) ...................................... 2000-123073

(51) Int. Cl.[7] ............................................... G11C 8/00
(52) U.S. Cl. ............................. 365/230.08; 365/233.5; 365/233
(58) Field of Search ......................... 365/230.08, 233.5, 365/233, 222, 194, 193

(56) References Cited

U.S. PATENT DOCUMENTS

| | | | |
|---|---|---|---|
| 4,677,592 A | | 6/1987 | Sakurai et al. |
| 5,157,287 A | | 10/1992 | Sakagami |
| 5,436,865 A | | 7/1995 | Kitazawa |
| 6,031,769 A | | 2/2000 | Kim |
| 6,075,751 A | * | 6/2000 | Tedrow .................... 365/233.5 |
| 6,249,463 B1 | * | 6/2001 | Pascucci ..................... 365/194 |

FOREIGN PATENT DOCUMENTS

| | | |
|---|---|---|
| DE | 69121433 T2 | 2/1991 |
| EP | 0 166974 B1 | 5/1985 |
| EP | 0 166974 A2 | 5/1985 |
| EP | 0 444683 A2 | 2/1991 |
| JP | 60-211691 | 10/1985 |
| JP | 61-5495 | 1/1986 |
| JP | 62-188095 | 8/1987 |
| JP | 3-253114 | 11/1991 |
| JP | 4-192185 | 7/1992 |
| JP | 7-29377 | 1/1995 |
| JP | 7-192470 | 7/1995 |
| JP | 08-203273 | 8/1996 |
| JP | 08-279733 | 10/1996 |
| JP | 09-055087 | 2/1997 |
| KR | 93-9150 | 9/1993 |
| KR | 96-9755 | 6/1996 |
| KR | 0155177 | 12/1998 |

* cited by examiner

Primary Examiner—David Lam
(74) Attorney, Agent, or Firm—Choate, Hall & Stewart

(57) ABSTRACT

A semiconductor memory device is provided which does not malfunction even when noise, generated inside or outside a chip, superimposes on an address. Power source noise is generated internally when a sense amplifier is activated (times t7 and t13) and during data output operations (time t14); in addition, system noise from outside is generated at certain times. By internally capturing an address "Address", which is input from the outside, at the rise (time t10) of a latch control signal LC, an input sensitivity control signal IC is made valid (times t6–t12) after an address skew period (times t1–t4), and sensitivity with respect to the address is reduced, canceling noise on the address. Furthermore, the latch control signal LC is lowered after a data output operation (time t17). Consequently, this cancellation of the latch state prevents the generation of an incorrect address transition detect signal ATD from the address appearing the noise.

17 Claims, 9 Drawing Sheets

SEMICONDUCTOR STORAGE DEVICE

TECHNICAL FIELD

The present invention relates to a semiconductor memory device which latches an address applied from the outside and uses it in internal chip operations, and more particularly relates to the semiconductor memory device which detects changes in the address applied from the outside as a trigger for latching the address, and uses it in internal operations.

BACKGROUND ART

There is a conventional semiconductor memory device which, after latching an address applied from the outside, uses the latched address in operations of circuits positioned at later stages. FIG. 10 is a circuit diagram showing a schematic constitution of the path to latching the address applied from the outside in a semiconductor memory device of this type.

A number of address buffers 100 are provided in accordance with the number of bits in an input address IN, supplied from outside the semiconductor memory device, and the number of latches in a latch circuit 101 is the same as the number of address buffers 100. The output from the latch circuit 101 is used in operations of many circuit parts positioned at later stages. Furthermore, the input address IN is input to the latch circuit 101 after being buffered by the address buffer 100.

While an address latch signal AL is at the low level (hereinafter abbreviated as "L"), the latch circuit 101 passes addresses sent from the address buffer 100. Then, when the value of the input address IN has been determined, an unillustrated timing signal generating circuit generates a pulse as the address latch signal AL. Using the rise of this pulse as a trigger, the latch circuit 101 latches the address output from the address buffer 100 and outputs to unillustrated circuits positioned at later stages than the latch circuit 101. Furthermore, these circuits also use the pulse of the address latch signal AL as a trigger, and commence operations based on the output of the latch circuit 101.

In this way, the conventional semiconductor memory device is configured so that the output of the address buffer 100 is input unaltered to the latch circuit 101. For this reason, when the address latch signal AL rises while noise which has been generated inside and outside the chip superimposes on the input address IN, there is a danger that the latch circuit 101 will latch the address containing noise, so that the value of the address will be in error depending on the size of the noise.

In particular, when noise superimposes on the address immediately before the latch circuit 101 latches the address, the latching operation is performed while the effects of the noise remain, increasing the danger of a mistaken address being latched. Since circuits positioned at later stages than the latch circuit 101 commence operations in accordance with the generation of the address latch signal AL, they will use the mistaken address output from the latch circuit 101 and perform malfunctions.

In addition to the above, an information processing apparatus is disclosed in, for instance, Japanese Unexamined Patent Application, First Publication No. Hei 8-203273, as a method of removing noise such as glitches from a memory address. In this information processing apparatus, a noise-canceling circuit is provided between a memory controller and the semiconductor memory device (memory). Then, the noise-canceling circuit operates based on a strobe signal for predicting changes in the memory address, and removes noise on the memory address supplied from the memory controller to the memory. However, this information processing apparatus can do nothing more than remove noise on the memory address supplied to the memory from the memory controller, and provides no countermeasures whatsoever against noise generated inside the memory. Consequently, there is a problem of malfunctions when, for example, power source noise and the like has been generated inside the memory and superimposed on the memory address.

Furthermore, even in the case where the noise-canceling circuit and the memory are integrated to form a single chip, and the noise-canceling circuit attempts to remove noise generated within the memory, there is no countermeasure against noise which is fed back from circuit inside the chip to the noise-canceling circuit at the entrance of the chip. Therefore, there is a possibility of malfunctions due, for example, to noise on the strobe signal itself, which is supplied to the noise-canceling circuit.

Moreover, in a constitution using the strobe signal, since the operations performed within the system are substantially similar to those when using a clock in a synchronous semiconductor memory device, power consumption in the system increases. For this reason the above information processing apparatus has a problem that it cannot be applied in mobile products where low power consumption is a requirement, such as in a mobile telephone, which is one of the products which the present invention is to be applied in. The information processing apparatus mentioned above has various other problems, such as having a more complex system due to the need for a timing mechanism between the strobe signal and the memory address, the problem that the strobe signal itself becomes a source of noise, and so on.

DISCLOSURE OF THE INVENTION

The present invention has been realized in consideration of the points described above, and aims to provide a semiconductor memory device which does not malfunction after capturing a mistaken address appearing noise, whether the noise has been generated inside or outside the chip. Other objects of the present invention will become clear from the embodiments of the invention described below.

In order to achieve the above object, a semiconductor memory device according to a first aspect of the present invention comprising a control circuit that comprises: a latch circuit for latching a second address signal for a predetermined period and outputting a first address signal to a predetermined circuit; and a filter circuit for outputting a signal whose sensitivity with respect to an input address signal having been lowered, to the latch circuit as the second address signal during a period including the time when the latch circuit latches the second address signal, the predetermined circuit including memory cells operating in response to the first address signal. Consequently, there is no danger that the latch circuit latches an incorrect input address signal, leading to a malfunction, even if noise generated inside or outside a chip superimposes on an address.

In the semiconductor memory device according to the first aspect, the filter circuit may lower the sensitivity with respect to the input address signal from a predetermined time after the input address signal has been determined until at least the time when the latch circuit latches the second address signal. Consequently, this increases the resistance to system noise and the like from the outside immediately before latching, which is the time when there is the greatest danger of an incorrect address appearing noise being latched. Furthermore, while the input address signal is changing due to the skew, the change can be transmitted speedily to circuits positioned at later stages than the latch circuit. Moreover, when the input address signal has been determined, changes therein need not be speedily transmitted, and therefore, effects of noise generated inside and outside the chip can be cancelled by lower the sensitivity to the input address signal.

In the semiconductor memory device according to the first aspect, when the timing of starting to lower the sensitivity with respect to the input address signal has coincided with the timing of noise superimposing on the second address signal supplied to the latch circuit, the filter circuit starts to lower the sensitivity with respect to the input address signal, using the timing of the latching of the second address signal by the latch circuit as a reference, at least before the time required to return to a level where the input address signal on which noise is superimposed is not identified as an incorrect address signal by the latch circuit in a state of lowered sensitivity. Consequently, even when the timing of starting to lower the sensitivity with respect to the input address signal has coincided with the timing of noise superimposing on the input address signal, an address without effects of noise is latched; therefore, the semiconductor memory device can be prevented from malfunctions.

Furthermore, the semiconductor memory device according to the first aspect may further comprise a sense circuit for sensing data stored in memory cells, and wherein the filter circuit starts to lower the sensitivity with respect to the input address signal before the timing of activating the sense circuit. Therefore, it is possible to prevent an incorrect address being latched due to power source noise, generated at the activation of a sense circuit such as a sense amplifier.

In the semiconductor memory device according to the first aspect, the filter circuit may lower the sensitivity with respect to the input address signal after a change in the input address signal has been transmitted to the predetermined circuit positioned at later stages than the latch circuit. Therefore, even in cases where the timing of the determination of the input address signal is delayed due to variations in manufacture and reasons relating to the system, such changes can be speedily transmitted to circuits positioned at later stages than the latch circuit.

A second aspect of the semiconductor memory device of this invention comprises a latch circuit for latching an input address signal for a predetermined period, and outputting the first address signal to the predetermined circuit; and a timing setting circuit for latching the input address signal in the latch circuit at a timing when effects of noise on the input address signal disappear (e.g. a timing where there are no effects of noise caused by activating a sense circuit such as a sense amplifier), the predetermined circuit comprising memory cells operating in response to the first address signal. Consequently, when system noise from outside poses no serious problem, the filter circuit of the semiconductor memory device according to the first aspect of the present invention need not be provided, and malfunctions resulting from power source noise generated inside the chip can be prevented.

Furthermore, a third aspect of the semiconductor memory device according to this invention comprises a latch circuit for latching an input address signal for a predetermined period, and outputting the first address signal to the predetermined circuit; and a timing setting circuit for canceling the latch state of the latch circuit after a timing at which noise can be generated inside a chip (e.g. after the end of an output operation of one or multiple data read from the memory cell, or after the timing of activating the sense circuit such as the sense amplifier), the predetermined circuit comprising memory cells operating in response to the first address signal. Consequently, in the latched state, malfunctions caused by system noise from the outside and malfunctions caused by predictable power source noise generated inside the chip can be prevented; and, after the latched state has been cancelled, in preparation for the next access request input from the outside, change in the input address signal can be speedily transmitted to the sections in the semiconductor memory device.

In the semiconductor memory device of this invention, in the memory cycle which a refresh is performed in, the refresh to memory cells and reading or writing from and to memory cells may all be performed within the period of a single memory cycle. This type of semiconductor memory device operates internally at twice the memory cycle seen from the outside, consequently increasing the peak value of the noise and increasing the possibility of malfunctions. However, by applying the present invention, malfunctions caused by noise can be prevented without countermeasures such as increasing power source, which in turn increases the area of the chip.

Furthermore, a control circuit of this invention comprises the semiconductor memory device of this invention described above at least excluding the memory cells, and achieves the same effects as the semiconductor memory device described above.

BEST MODE FOR CARRYING OUT THE INVENTION

Embodiments of the present invention will be explained with reference to the drawings.

Embodiment 1

This embodiment applies the present invention in a semiconductor memory device previously proposed by the inventors of the present invention (Japan Patent Application (Unpublished) No. Hei 11-345345; hereinafter "first relevant invention").

The semiconductor memory device of the first relevant invention uses the same memory cell as a general-purpose DRAM (dynamic random access memory) and, when viewed from the outside, operates with the same specifications as a general-purpose SRAM (static RAM). For this reason, as in existing pseudo-SRAMs, power consumption is low since there is no need to change the CE (chip enable) signal, comprising an address latch timing control function, for each access. Furthermore, the apparatus is as easy to use as the SRAM, and its capacity can be increased without increasing the size of the chip. Therefore, its specifications are suitable for mobile telephones and the like of the coming generation. In this specification of the present application, this type of semiconductor memory device will be termed "SRAM-specified DRAM" or "MSRAM (mobile specified RAM)".

As will be explained later, since the MSRAM performs refresh and read/write in one memory cycle, the operation in the semiconductor memory device are performed at twice the cycle of the memory cycle seen from the outside. Consequently, although the same memory cell is used, the speed of the internal operations must be higher than that of the general-purpose DRAM and the like, increasing the peak value of the noise which is generated and leading to malfunctions. The noise peak value can be reduced by strengthening the power source and the like, but such countermeasures inevitably increase the size of the chip. Therefore, it is preferable to arrange the circuit so that there are no malfunctions even when the noise peak value increases.

Furthermore, the MSRAM does not capture the address in compliance with a clock, as in a synchronous semiconductor memory device, but detects change in access address and chip select signals, applied from the outside, and captures the access address by using this change as a trigger, and then commences internal operations. This makes the MSRAM extremely sensitive to noise on the address, and noise countermeasures are therefore important. It is not appropriate to provide noise countermeasures at each individual circuit which the noise on the address has propagated through to various parts of the chip; preferably, noise countermeasures should be provided at the initial circuit which the address is input to from the outside.

Figure 1:
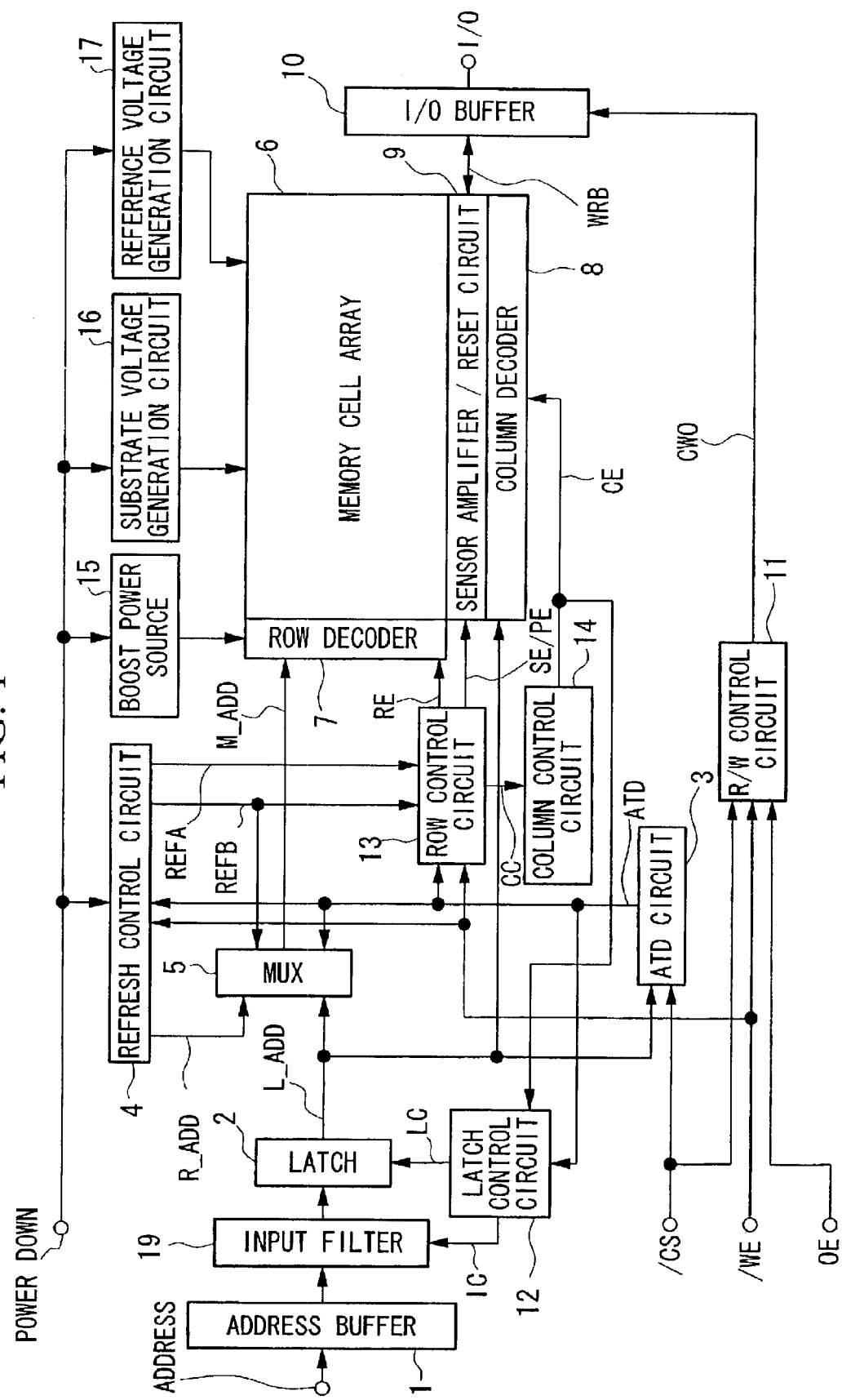
FIG. 1 is a block diagram showing the constitution of a semiconductor memory device according to a first embodiment of the present invention.
Figure 2:
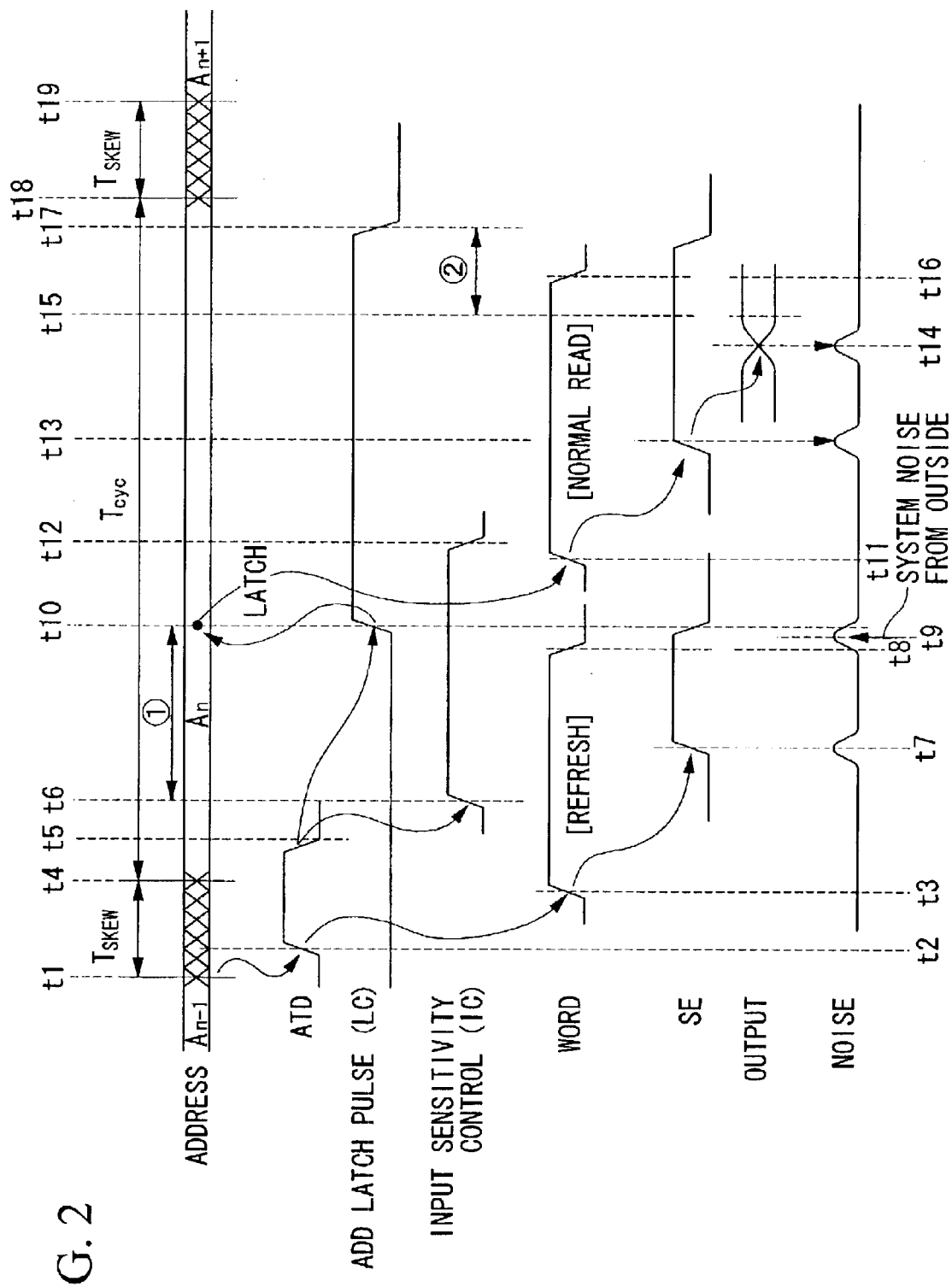
FIG. 2 is a timing chart showing an operation of the semiconductor memory device according to the same embodiment.

FIG. 1 is a block diagram showing the constitution of a semiconductor memory device according to this embodiment of the present invention. FIG. 2 is a timing chart showing an operation of the semiconductor memory device according to this embodiment. The timing of the noise problem will be explained while referring to FIGS. 1 and 2. Circuits relating to a noise filter, the principal feature of this embodiment, will be described first, and other circuits will be described in detail later.

Firstly, an access address ("Address") is supplied from outside the semiconductor memory device, and comprises a row address and a column address in correspondence with a memory cell array 6 (explained later) which is arranged in rows and columns. Subsequently, an address buffer 1 buffers the address "Address" and outputs it to an input filter 19. Next, while a latch control signal LC is "L" (that is, the period from the fall of the latch control signal LC to its rise), a latch 2 passes the address, which is input from the address buffer 1 via the input filter 19, and outputs it as an internal address L_ADD.

Furthermore, the latch 2 captures the address, supplied from the address buffer 1 via the input filter 19, at the rise of the latch control signal LC, stores it while the latch control signal LC is at the high level (hereinafter abbreviated as "H"), and outputs the stored address as the internal address L_ADD. This is due to the fact that when there is a change in the address, supplied to sections positioned at later stages than the latch 2 changes during reading and writing from/to the memory cell array 6, a word line other than that which should be activated becomes active, and the data is destroyed. Accordingly, the latch 2 captures the address "Address" to prevent the address supplied to the sections positioned at later stages than the latch 2 from changing during reading and writing.

The input filter 19 is provided between the address buffer 1 and the latch 2, and functions as a noise filter. As explained above, the time immediately before the latch 2 carries out latching is the period when there is greatest danger of an address appearing noise being latched, leading to a malfunction, and this is the time when noise-resistance must be ensured. Therefore, this embodiment comprises the input filter 19 to prevent noise from superimposing on the address supplied to the latch 2 at this time.

The input filter 19 is controlled by the level of an input sensitivity control signal IC, and reduces its sensitivity to the input address when the input sensitivity control signal IC is "H", thereby canceling or reducing noise, and outputting a waveform which is unaffected by noise. On the other hand, when the input sensitivity control signal IC is "L", the input filter 19 outputs the input address to the latch 2. The specific constitution of the input filter 19 will be described later.

Subsequently, since the MSRAM uses the same memory cell as a general-purpose DRAM, the memory cell must be refreshed. For this reason, in addition to self-refreshing in the same manner as the general-purpose DRAM, as shown in FIG. 2, when there has been a request from the outside for normal reading or writing, the MSRAM performs the requested normal reading and writing after a refresh.

Therefore, when the externally supplied address "Address" changes, or when the chip select signal/CS becomes valid, an ATD (address transition detector) circuit 3 detects these changes and generates a positive one-shot pulse as the address transition detect signal ATD, thereby activating the refresh. Then, when this refresh has ended, the latch 2 captures the addresses "Address" which have been determined up to that point, and normal reading and writing is carried out from/to the memory cell array 6 based on the internal address L_ADD, output from the latch 2.

There are two principle types of noise which is particularly likely to be a problem in the MSRAM: system noise, generated outside the chip, and internal noise such as power source noise, generated inside the chip. System noise from the outside which, for example, superimposes on the address output from the address buffer 1, can be regarded as equivalent to internally generated noise which, for example, is fed back to the address buffer 1 and superimposes on its output.

The difference between the two lies in the time at which the noise is generated.

System noise from the outside is a problem in general semiconductor memory devices, not only in the MSRAM, and may occur at any time without relation to the internal operation of the semiconductor memory device. In contrast, noise generated inside the chip may comprise power source noise and the like, generated by fluctuation in the power source potential or the potential of the ground inside the chip caused by the flow of a peak current. There are several possible reasons for the peak current, depending on the specifications of the semiconductor memory device, and it is possible to estimate the timing of the generation of the peak current at the time of design.

In the MSRAM, there are two main causes of peak current. The resultant peak currents due to these causes are generated at specific timings derived from the internal operations of the MSRAM, and the noise caused by these peak currents is one of the largest noises.

Regarding the first cause, consider a case where a sense amplifier is activated by raising a sense amplifier enable signal SE leading to an abrupt increase in current consumption; the power source potential and ground potential fluctuate as a result, generating considerable power source noise. The sense amplifier enable signal SE is activated at the time of a refresh, normal reading, or normal writing, although increase in the peak current is particularly liable to become a problem when data read from the memory cell is amplified during a refresh or during normal reading. Further, in the MSRAM, there are cases where refresh and normal reading and writing are performed in one memory cycle (time $T_{SKEW}$+cycle time $T_{cyc}$ in FIG. 2), and consequently, power source noise caused by activation of the sense amplifier may be generated twice within one memory cycle. Incidentally, since a write potential is supplied from the outside during normal writing, the peak current is not as great as that during refresh and normal reading.

Regarding the second cause, consider a case where current consumption increases when data read from the memory cell during normal reading is output to the outside of the semiconductor memory device. That is, during the data output operation, an I/O buffer 10 charges and discharges a bus I/O and a subsequently connected system bus outside the chip. Consequently, there is a possibility that the peak value of the consumed current will greatly increase, and a danger that considerable power source noise will be generated inside the chip in the same manner as the rise of the sense amplifier enable signal SE.

As described above, in the MSRAM, when normal reading is performed after a refresh, there is a possibility that considerable power source noise will be generated continuously at the activation of the sense amplifier during the refresh, at the activation of the sense amplifier during normal reading, and at the time of the data output operation during normal reading, leading to an even greater danger of malfunctions than that in a general-purpose SRAM and a general-purpose DRAM.

It is useful to provide two countermeasures to prevent such malfunctions caused by noise. Firstly, with regard to the period from the change of the address "Address" to its capture by the latch 2, as described above, it is desirable that noise countermeasures are provided in the input stage inside the semiconductor memory device. Therefore, a noise cancellation unit comprising a noise filter (the input filter 19 of FIG. 1) which reduces its sensitivity toward the address output from the address buffer 1, and thereby reduces the possibility that the latch 2 positioned at a later stage will detect the noise.

Furthermore, regarding the timing of the noise cancellation, the noise superimposing on the address should be cancelled or reduced during the period from a point at a predetermined time prior to the latch timing to the latch timing itself (period ① in FIG. 2). As a consequence, it is possible to prevent malfunctions due to power source noise caused by the activation of the sense amplifier during the refresh and system noise from the outside.

The approximate setting of the period ① in FIG. 2 should be made after the following considerations. Firstly, when the sensitivity of the input filter 19 is reduced while the address "Address" is changing normally, transmission of the change in the address "Address" and the determination of the address "Address" to circuits positioned at later stages is delayed. As a result, the sensitivity of the input filter 19 must be reduced at least after the address "Address" has been determined. That is, since the address "Address" and the chip select signal/CS have a skew, they are not determined until the time $T_{SKEW}$ shown in FIG. 2 has elapsed since the address "Address" started to change (hereinafter termed "address skew period"). Therefore, the start timing of the period ① should be set at least after the address skew period.

Furthermore, with regard to noise inside the chip, the period ① should preferably be set to include the rise timing (time t7 in FIG. 2) of the sense amplifier enable signal SE. Although the timing of the rise of the sense amplifier enable signal SE changes according to the specifications of the semiconductor memory device, it can be approximately calculated at the time of designing the semiconductor memory device. However, since this timing fluctuations according to temperature, power source voltage, variations in manufacturing processes, and the like, the period ① should be set widely with a margin.

It is not an essential condition that the period ① contains the rise of the sense amplifier enable signal SE. That is, when the effect of noise caused by activating the sense amplifier has disappeared before the latch timing (time t10 in FIG. 2), the start timing of the period ① may be set after the rise of the sense amplifier enable signal SE (after time t7 in FIG. 2). In other words, in this case, there need only be a sufficient gap between the latch timing and the timing of the internal power source noise generation. Therefore, in this case, the period ① is set when there is a need for countermeasures against system noise from outside.

Considering that system noise from outside may occur at any time, the start timing of the period ① cannot be set too late. This is because, while it is possible to cancel or reduce system noise from outside during the period ①, system noise occurring before the period ① may become a problem. That is, when the timing of shifting the sensitivity of the input filter 19 from a high state to a low state overlaps with the timing of the generation of system noise from outside, the reduction in sensitivity requires extra time until the effects of noise on the address disappear.

A worst case scenario is when noise superimposes on the address "Address" while the sensitivity of the input filter 19 is high, and the sensitivity of the input filter 19 is reduced immediately thereafter. That is, the time taken for the waveform of the address appearing the noise to return to the original waveform of an address without noise is longer, by an amount equivalent to the reduction in sensitivity of the input filter 19, than that in the case where the input filter 19 is not provided. Therefore, considering a case where the two timings overlap as mentioned above, the length of the period ① must be set so that the latch 2 captures the address after the waveform of the address appearing the noise has returned to the original waveform.

As already mentioned, in the case where the period ① is started after the sense amplifier enable signal SE has risen, when the effects of noise caused by activation of the sense amplifier remain, an inordinate amount of time is required for the waveform of the address to return to its original waveform by reducing the sensitivity of the input filter 19. Therefore, in this case, as in the case of system noise from the outside, consideration must be given to the length of the period ①.

Next, the period represented by ② in FIG. 2 may be reserved for the time from the capturing of the address by the latch 2 until the end of the memory cycle. That is, the latch control signal LC should be lowered to cancel the latch state of the latch 2 after the completion of the data output operation of data which has been read by normal reading. In other words, the timing of the fall of the latch control signal LC should be extended so that the latch 2 continues to hold the address at both the timings of activating the sense amplifier and outputting the read data to the outside.

Here, in the original operation of the MSRAM, when the data read from the memory cell array 6 by the sense amplifier has been captured by the I/O buffer 10, no problem is caused by ending access to the memory cell array 6 and lowering the latch control signal LC before the operation of outputting the data to the outside has been completed. That is, since the value of the address "Address" is stored until the point where the next memory cycle begins (time t18), even when the latch state of the latch 2 is cancelled and the address is passed through, the address value output for the internal address L_ADD will be the same as before.

However, problems arise when power source noise, generated inside the chip during the data output operation, has, for example, been fed back to the output of the address buffer 1. That is, as described later, at this point the input filter 19 passes the address for the shift to the next memory cycle. As a consequence, unless the latch 2 is storing the address, an address appearing noise will pass through the input filter 19 and the latch 2 and will be supplied to the internal sections of the semiconductor memory device.

When an address appearing noise is, for example, supplied to the ATD circuit 3, the ATD circuit 3 mistakenly identifies this as a new address transition, and generates a one-shot pulse as the address transition detect signal ATD. Then, the one-shot pulse activates a new internal operation, leading to a malfunction. Accordingly, the latch state of the latch 2 is not cancelled until the data output operation is complete, and, for example, even when there is noise on the address, the address without noise stored by the latch 2 is supplied to the sections positioned at later stages than the latch 2, thereby avoiding malfunctions.

Figure 3:
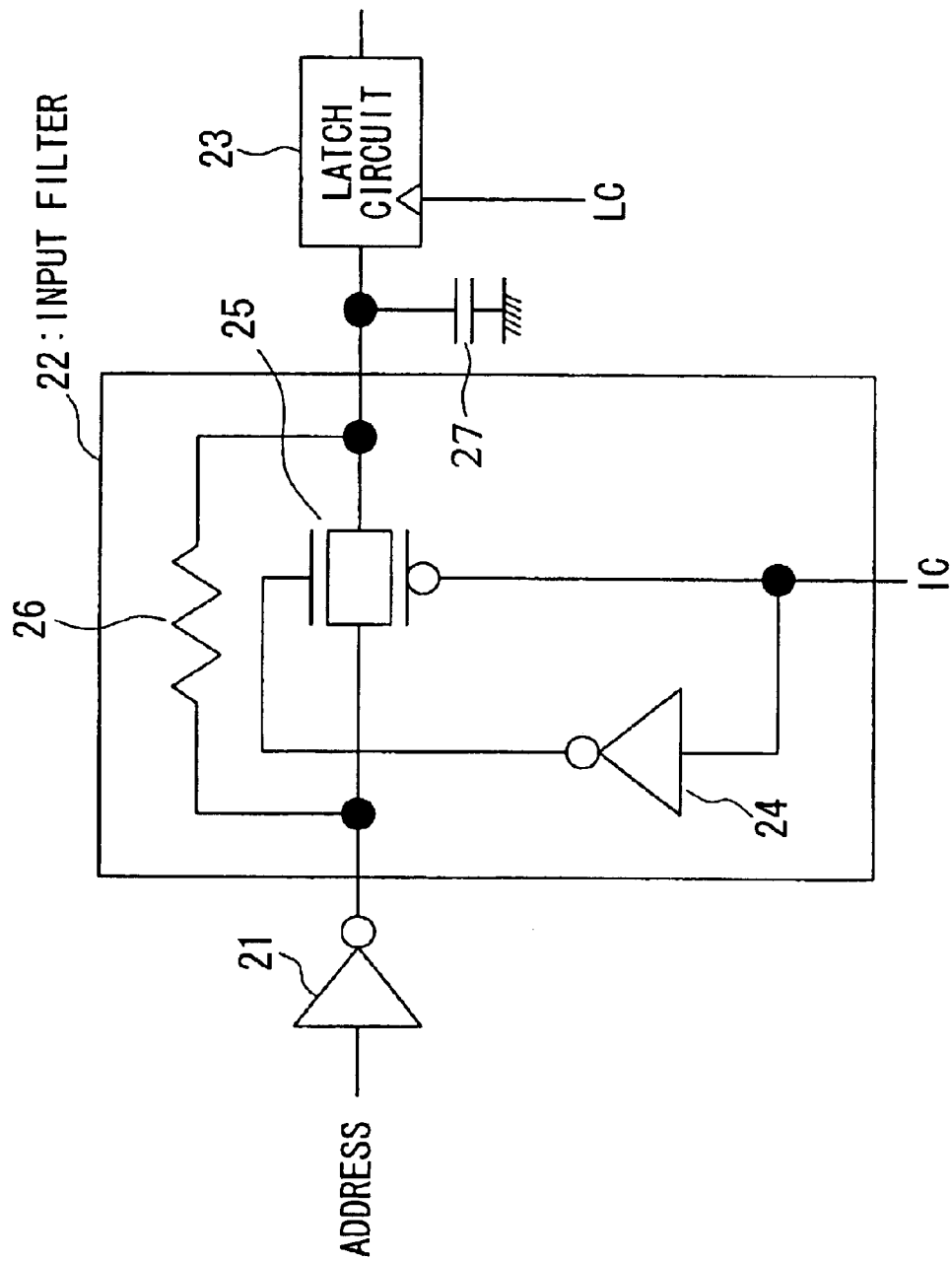
FIG. 3 is a circuit diagram showing a first constitution example of an input filter according to the same embodiment.

Subsequently, a specific constitution of the input filter 19 will be explained. Various constitutions for the input filter 19 may be considered; two examples will be presented here. FIG. 3 is a circuit diagram showing a first example of the constitution of the input filter 19, being the circuits shown in the constitution of FIG. 1 from the address buffer 1 to the latch 2. The address buffer 21, the input filter 22, and the latch circuit 23 correspond to one-bit portions of the address "Address" of the address buffer 1, the input filter 19, and the latch 2 shown in FIG. 1.

The input filter 22 comprises an inverter 24, a transfer gate 25, and a resistance element 26. The transfer gate 25 is connected in parallel with the resistance element 26 between the address buffer 21 and the latch circuit 23, and is switched on/off in accordance with the level of an input sensitivity control signal IC. The resistance element 26 is a resistance element having a high resistance value (e.g. 50 kΩ), and comprises a CR filter in combination with a parasitic capacitance 27 shown in FIG. 3.

As mentioned earlier, the input sensitivity control signal IC rises to "H" when the output of the address buffer 21 is lowered to cancel or reduce noise, and becomes "L" when the output of the address buffer 21 is to be transmitted at high speed to the latch circuit 23. That is, when the input sensitivity control signal IC becomes "H", the n-channel and p-channel MOS (metal oxide semiconductor) transistors (hereinafter sometimes abbreviated as "Tr") which comprise the transfer gate 25 are all cut off.

For this reason, even when there is noise on the address output from the address buffer 21, no mistaken address is input to the latch circuit 23 since the CR filter smoothens the waveform. On the other hand, since the transfer gate 25 switches ON when the input sensitivity control signal IC becomes "L", both terminals of the resistance element 26 are short-circuited and the output of the address buffer 21 is transmitted to the latch circuit 23 at low impedance. Consequently, when change in the address "Address" is transmitted to circuits positioned at later stages than the latch circuit 23, the waveform is made less sharp to ensure that there is no delay in transmitting the change in the address. Incidentally, the timings of the input sensitivity control signal IC and the latch control signal LC will be explained later.

Figure 4:
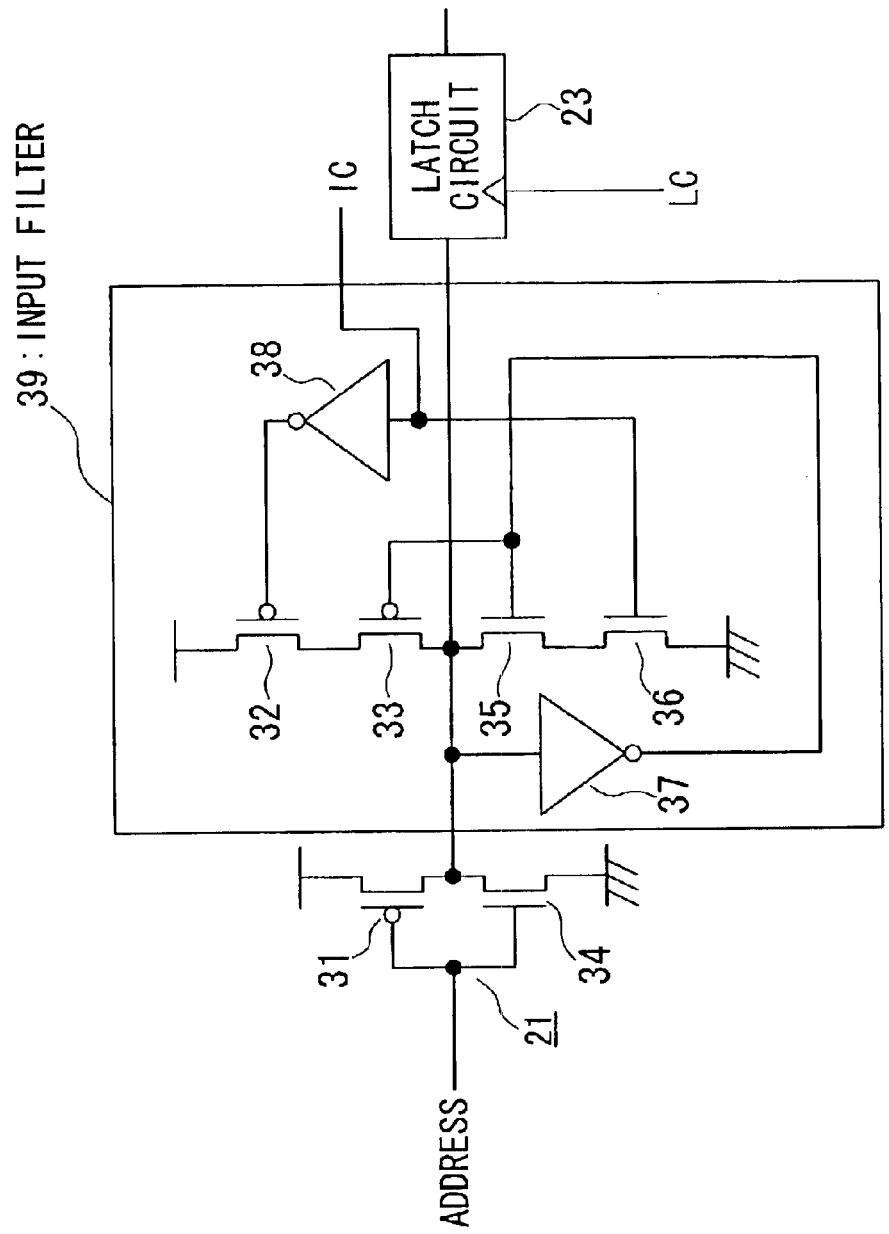
FIG. 4 is a circuit diagram showing a second constitution example of an input filter according to the same embodiment.

Subsequently, FIG. 4 is a circuit diagram showing a second example of the constitution of the input filter 19 shown in FIG. 1, wherein the same constituent elements as those shown in FIG. 3 are represented by the same reference numerals. In FIG. 4, Tr 31 to Tr 33 represent p-channel MOS transistors, and Tr 34 to Tr 36 represent n-channel MOS transistors. Of these, Tr 31 and Tr 34 comprise the address buffer 21 shown in FIG. 3.

In the constitution of FIG. 4, an input filter 39 comprises Tr 32, Tr 33, Tr 35, Tr 36, and inverters 37 and 38. Of these, the inverter comprising Tr 33 and Tr 35 and the inverter 37 are connected in a closed loop, enabling the output of the inverter 37 to be fed back to its own input. Next, Tr 32 and Tr 36 operate in accordance with the level of the input sensitivity control signal IC, both transistors cutting off when the signal is "L", so that the input filter 39 allows the input signal to pass through. On the other hand, when the input sensitivity control signal IC is "H", both transistors switch on, whereby the input filter 39 functions as a hysteresis circuit.

Here, the power source voltage is $V_{DD}$ and the threshold voltage of the latch circuit 23 is $(½)V_{DD}$. In this case, in a constitution where the output of the address buffer 21 is input unchanged to the latch circuit 23, as in the conventional semiconductor memory device, when noise superimposes on the address output from the address buffer 21 and exceeds $(½)V_{DD}$, the latch circuit 23 will latch a mistaken address.

In contrast, in this embodiment, since the input filter 39 has hysteresis characteristics, no such a malfunction occurs. Now, when the voltage input to the address buffer 21 is voltage Vin, and the voltage output from the input filter 39 is voltage Vout, when the input sensitivity control signal IC is "H", the input and output characteristics of the circuit comprising the address buffer 21 and the input filter 39 will be those shown in FIG. 5.

Figure 5:
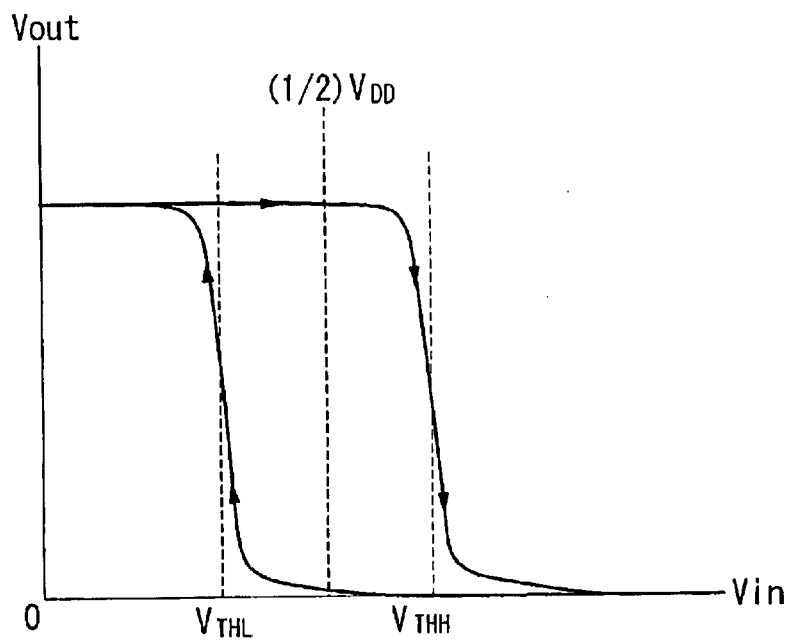
FIG. 5 is a graph showing the relationship between a voltage Vin and a voltage Vout, which are an input voltage and an output voltage to an address buffer 21 and an input filter 39 shown in FIG. 4.
Figure 10:
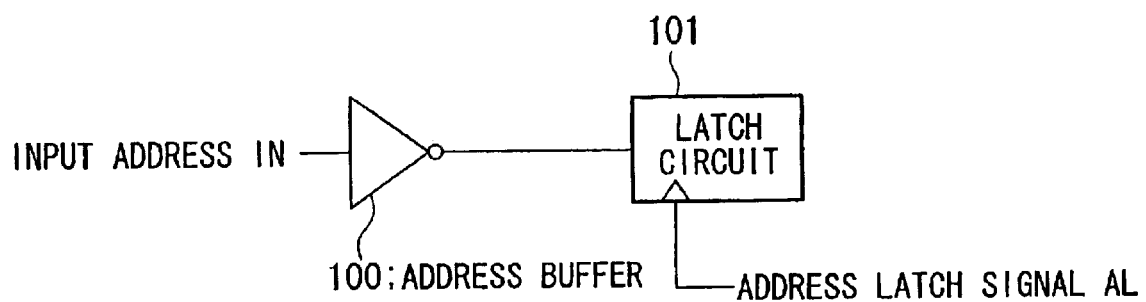
FIG. 10 is a circuit diagram showing the constitution of a path until an externally input address is latched in a conventional semiconductor memory device.

Firstly, when voltage Vin is caused to transition from "L" to "H", the voltage Vout cannot be caused to transition to "L" unless the voltage Vin is equal to or greater than a threshold voltage $V_{THH}\{>(½) V_{DD}\}$. That is, when the voltage Vin is "L", both the p-channel transistors Tr 31 and Tr 33 are ON, and therefore, voltage Vout cannot be made "L" without inverting the states of these transistors. Therefore, as shown in FIG. 5, voltage Vin must be higher than (½) $V_{DD}$.

On the other hand, when voltage Vin is caused to transition from "H" to "L", the voltage Vout cannot be caused to transition to "H" unless the voltage Vin is equal to or lower than a threshold voltage $V_{THL}\{<(½)V_{DD}\}$. That is, when the voltage Vin is "H", both the n-channel transistors Tr 34 and Tr 35 are ON, and therefore, voltage Vout cannot be made "H" without inverting the states of these transistors. Therefore, as shown in FIG. 5, voltage Vin must be made lower than (½) $V_{DD}$. In this way, in the constitution of FIG. 4, the region of the threshold voltages $V_{THL}$ to $V_{THH}$ maintains a noise margin so that noise is not detected.

Explanation of the Constitution

Subsequently, circuits in the constitution shown in FIG. 1 other than those relating to the input filter 19 will be explained. Firstly, in the case where the chip select signal/CS is valid ("L"), when one of the internal addresses L_ADD has changed by even one bit, the ATD circuit 3 outputs a positive one-shot pulse as the address transition detect signal ATD. The ATD circuit 3 outputs a positive one-shot pulse as the address transition detect signal ATD even in the case where the chip select signal/CS has become valid. Incidentally, the chip select signal/CS is a select signal which becomes valid when accessing the semiconductor memory device shown in FIG. 1. Furthermore, the symbol "/", appended at the head of the signal name, signifies that the signal has negative logic.

Explained in greater detail, the ATD circuit 3 generates a one-shot pulse for the bit which changed first among the bits of the address "Address", and, when another bit changes while this one-shot pulse is being generated, combines the one-shot pulse already being generated with a newly generated one-shot pulse. Consequently, when there is a skew in the address "Address", although the pulse width of the one-shot pulse increases by an amount equivalent to the skew of the address "Address", there is no danger of multiple one-shot pulses being generated in the address transition detect signal ATD by a single address change. Therefore, there is no problem of destroying the data in the memory cell as a result of simultaneous activation multiple word lines by the generation of multiple address transition detect signals ATD.

Furthermore, the chip select signal/CS is a signal for determining select/deselect of the semiconductor memory device (chip), and in particular, is an activation signal used for selecting a desired semiconductor memory device in a system comprising multiple semiconductor memory devices. In the explanation that follows, the chip select signal used is an activation signal for determining select/deselect of the chip, but the activation signal usable in this invention is not limited to a chip select signal, and may be any type of signal which has similar functions.

For example, a chip enable signal may be used instead of the chip select signal. However, some so-called chip enable signals have an address latch timing control function in addition to a chip activation function, such as a chip enable signal in an existing pseudo-SRAM. That is, in existing pseudo-SRAMs, in order to control the timing of the address capture, the chip enable signal is input in each cycle in the manner of a clock signal, leading to a problem of increased power consumption. In contrast, the semiconductor memory device of this invention is able to operate without inputting the signal which triggers internal operations in each cycle in the manner of a clock signal. For such reasons, when a chip enable signal is used as the activation signal in this invention, a signal having a chip activation function but not an address latch timing control function is used.

A refresh control circuit 4 contains an address counter (refresh counter) and a refresh timer. The address counter sequentially creates a refresh address R_ADD for refreshing the DRAM memory cells. The refresh address R_ADD has the same bit width as the row address in the address "Address". Then, in addition to these, the refresh control circuit 4 uses the address transition detect signal ATD and the write enable signal/WE to control internal refreshing of the semiconductor memory device by automatically generating a refresh address and a refresh timing inside the semiconductor memory device, and carries out a refresh similar to a self-refresh in a general-purpose DRAM.

The refresh timer counts the time elapsed from the last access request from outside the semiconductor memory device, and activates a self-refresh inside the semiconductor memory device when this time has exceeded a predetermined time (hereinafter "refresh time"). To achieve this, the refresh timer is reset and recommences counting each time the address transition detect signal ATD becomes valid. The "predetermined time" mentioned above should be set based on the data hold characteristics (e.g. the data hold time) of the memory cell.

In addition, the refresh control circuit 4 generates refresh control signals REFA and REFB for controlling the refresh timing. The refresh control signal REFA is a signal for controlling whether to perform a refresh accompanying an access request from outside the semiconductor memory device, the refresh being performed when the signal is "H" and not performed when the signal is "L".

In this embodiment, the refresh operation using as a trigger the generation of the address transition detect signal ATD presupposes the following realization aspects. That is, in this embodiment, when refresh operations are performed continuously to accompany reading and writing, the refreshes are carried out continuously in each memory cycle, refreshing the entire memory cell. Once all the memory cells have been refreshed, the status is momentarily switched to one in which no refreshes are generated. Thereafter, when the status approaches the limit at which data can be held in the memory cell (cell hold limit), the status is switched back to one in which refreshes are performed intermittently in continuous memory cycles.

For these reasons, the refresh control signal REFA is lowered when, even though the refresh of one refresh cycle has been completed by a refresh accompanying an access request from outside, there is still time remaining until the activation of the refresh of the next refresh cycle, or when a self-refresh has been activated and there is no need to perform a refresh accompanying an access request from outside until the self-refresh is completed.

In one conceivable constitution for creating the refresh control signal REFA, a latch circuit for holding the refresh control signal REFA is provided inside the refresh control circuit 4, and this latch circuit is set and reset by using the address transition detect signal ATD and the output from the refresh timer. More specifically, the refresh timer generates a timing slightly before a refresh operation is required (slightly before the cell hold limit), a set signal for the latch circuit is generated inside the refresh control circuit 4 based on that output signal, the latch circuit is set, and the refresh control signal REFA is output at the "H" level. Incidentally, the timing of generating the set signal is determined using the maximum cycle time as a standard. Thereafter, using the address transition detect signal ATD or the refresh control signal REFB, generated based on the refresh control signal REFA, a row control circuit 13 (explained later) performs a refresh operation of the memory cells in word line units. Then, when all the memory cells have been refreshed, a reset signal for the latch circuit is generated inside the refresh control circuit 4, resetting the latch circuit, and the refresh control signal REFA outputs at "L".

The latch circuit may be reset in the refresh cycle which refreshes the final word line, in correspondence with the time at which the refresh operation ends. Alternatively, the row control circuit 13 may generate a refresh operation completion signal when the refresh operation is complete, the latch circuit being reset when the refresh control circuit 4 has received this refresh operation completion signal in the refresh cycle for the final word line. However, unless an address transition detect signal ATD is generated, or a write enable signal/WE is input, during the period from the rise of the refresh control signal REFA to the end of the first refresh performed following this rise, the latch circuit is reset when the first refresh has ended.

On the other hand, the refresh control signal REFB is a signal for self-refreshing. That is, by applying a negative one-shot pulse to the refresh control signal REFB, it is possible to forcibly generate a positive one-shot pulse to the row enable signal RE and activate a refresh. Here, to create the refresh control signal REFB, a delay circuit for delaying the refresh control signal REFA and a pulse generating circuit for generating the negative one-shot pulse may be provided in the refresh control circuit 4, the constitution being controlled by the refresh control signal REFA, in which the timing of generating the negative one-shot pulse from the pulse generating circuit has been delayed by the delay circuit, and the address transition detect signal ATD.

Ordinarily, the refresh control signal REFB is at the "H" level. In this state, when the refresh control signal REFA has be raised to "H", the delay circuit delays the rise of the refresh control signal REFA by a predetermined time, and, when no address transition detect signal ATD has been generated during this delay, the pulse generating circuit is activated by the rise of the delayed refresh control signal REFA, outputting a negative one-shot pulse as the refresh control signal REFB. The delay of a predetermined time is provided in order to measure the time until the limit of time required to refresh the memory cell is reached, since the trigger which generates the address transition detect signal ATD cannot be applied from the outside. Furthermore, when the write enable signal/WE has been lowered during the delay, the refresh is performed after the writing operation; consequently, the timing of the rise of the refresh control signal REFA and the predetermined time of the delay are set with due consideration for the time needed for this writing operation.

The present invention is not limited to the realization of the refresh operation described above; for example, the memory cells may be refreshed at fixed cycles for each of one or multiple word lines. In such an arrangement, when the refresh operation using the address transition detect signal ATD as a trigger ends, the refresh control signal REFA falls in each memory cycle. Furthermore, the circuit constitution for generating the refresh control signal REFB may be the same as that described above, but the circuit constitution for generating the refresh control signal REFA is, for example, as follows.

Firstly, the refresh timer generates a trigger signal at a fixed cycle for activating the refresh. Next, in the same manner as in the case described above, a latch circuit is provided in the refresh control circuit 4, and, based on the trigger signal output by the refresh timer, the latch circuit is set by a set signal generated at a timing slightly before the refresh operation is required, and the refresh control signal REFA is raised to "H". Similarly in this case, the timing of generating the set signal is determined using the maximum cycle time as a standard.

Thereafter, in correspondence with the timing when the row control circuit 13, which has received the address transition detect signal ATD or the refresh control signal REFB, completes the refresh operation of the memory cells, the refresh control circuit 4 resets the latch circuit by using the generated reset signal, switching the refresh control signal REFA to "L". In this case, the latch circuit should be reset at a timing which is delayed by a predetermined time after the latch circuit was set. Alternatively, a refresh operation completion signal is generated when the row control circuit 13 has completed the refresh operation, and the latch circuit is reset when the refresh control circuit 4 receives this refresh operation completion signal.

Subsequently, the multiplexer 5 of FIG. 1 ("MUX" in FIG. 1) operates in accordance with the levels of the address transition detect signal ATD and the refresh control signal REFB; when the address transition detect signal ATD is "L" and the refresh control signal REFB is "H", the multiplexer selects a row address contained in the internal address L_ADD (due to its complexity this will sometimes simply be referred to as "internal address L_ADD") when a predetermined time has elapsed since the fall of the address transition detect signal ATD (i.e. after the period which the refresh operation is to be performed in and prior to the period which the normal read or normal write operation is to be performed in), and outputs it as an address M_ADD. On the other hand, when the address transition detect signal ATD is "H", the multiplexer treats the point when a predetermined time has elapsed since the rise of the address transition detect signal ATD as the starting point, and, in the period until a predetermined time has elapsed since the fall of the address transition detect signal ATD (i.e. during the refresh operation), selects a refresh address R_ADD and outputs it as an address M_ADD. Furthermore, when the refresh control signal REFB is "L", the multiplexer 5 outputs the R_ADD as the address M_ADD.

The memory cell array 6 is the same as one used in a general-purpose DRAM, comprising word lines and bit lines (or bit line pairs; hereinafter the same) running parallel to the rows and columns, and, for example, as in the general-purpose DRAM, memory cell comprising one transistor and one capacitor is provided in a matrix-like arrangement at the intersection between the word line and bit line.

A row decoder 7 decodes the address M_ADD when the row enable signal RE is "H", and activates the word line specified by this address M_ADD. When the row enable signal RE is "L", the row decoder 7 activates none of the word lines. A column decoder 8 decodes the column address contained in the internal address L_ADD when a column enable signal CE is "H", and generates a column select signal for selecting the bit line specified by this column address. When the column enable signal CE is "L", the column decoder 8 does not generate a column select signal for any of the bit lines.

A sense amplifier/reset circuit 9 comprises unillustrated sense amplifiers, column switches, and a precharge circuit. Of these, the column switches connect the sense amplifiers, specified by a column select signal output from the column decoder 8, and a bus WRB. The sense amplifier is activated when the sense amplifier enable signal SE is "H", senses and amplifies the potential of the bit line, connected to the memory cell identified in the address "Address", and outputs it to the bus WRB; alternatively, the sense amplifier writes write data, supplied at the bus WRB, via the bit line to the memory cell. The precharge circuit becomes activated when a precharge enable signal PE is "H", and precharges the potential of the bit line to a predetermined potential (for example, (½) $V_{DD}$).

The I/O (input/output) buffer 10 operates in accordance with the level of a control signal CWO; when the signal CWO is "H", its output buffer buffers the read data on the bus WRB and outputs it from the bus I/O to outside the semiconductor memory device. Further, when the signal CWO is "L", the I/O buffer 10 switches its output buffer to a floating state, buffers the write data supplied to the bus WRB from outside the semiconductor memory device using its input buffer, and transmits it to the bus WRB. That is, reading is carried out when the control signal CWO is "H", and writing when it is "L".

Subsequently, a R/W (read/write) control circuit 11 generates a control signal CWO based on the chip select signal/CS, the write enable signal/WE, and the output enable signal OE. In the specifications of the semiconductor memory device according to this invention, writing (capturing) of data commences at the fall edge of the write enable signal/WE, the data is determined at the rise edge of the write enable signal/WE, and writing (capturing) ends. Further, the switch timing of the control signal CWO will become clear in the explanation of the operation. A latch control circuit 12 generates positive one-shot pulses in the latch control signal LC and the input sensitivity control signal IC, based on the fall edge of the address transition detect signal ATD. The timings and pulse widths of these one-shot pulses differ for the latch control signal LC and the input sensitivity control signal IC, and will be described in detail in the explanation of operations.

Subsequently, the row control circuit 13 generates a row enable signal RE, a sense amplifier enable signal SE, a precharge enable signal PE, and a control signal CC, based on the refresh control signal REFA, the refresh control signal REFB, the address transition detect signal ATD, and the write enable signal/WE. Furthermore, the column control circuit 14 creates a column enable signal CE based on the control signal CC.

Described in more detail, during reading and writing, the row control circuit 13 generates a positive one-shot pulse as the row enable signal RE, using the fall of the address transition detect signal ATD as a trigger. When the refresh control signal REFA is at "H", the row control circuit 13 generates a positive one-shot pulse, required for the refresh operation, in the row enable signal RE, by using the rise of the address transition detect signal ATD as a trigger.

That is, when the refresh control signal REFA is "H", the row control circuit 13 generates a one-shot pulse as the row enable signal RE at the rise of the address transition detect signal ATD caused by the access request, thereby activating a refresh. In contrast, when the refresh control signal REFA is "L", even when there is a one-shot pulse in the address transition detect signal ATD, the row control circuit 13 does not generate a one-shot pulse as the row enable signal RE.

Moreover, the row control circuit 13 outputs a positive one-shot pulse, obtained by inverting the negative one-shot pulse supplied to the refresh control signal REFB, as the row enable signal RE.

Furthermore, the row control circuit 13 delays the row enable signal RE and generates a positive one-shot pulse as the sense amplifier enable signal SE; in addition, the row control circuit 13 generates a positive one-shot pulse as the precharge enable signal PE using the fall of the one-shot pulse generated in the row enable signal RE as a trigger. The sense amplifier enable signal SE and the precharge enable signal PE are generated irrespective of whether the operation is normal read, normal write, or refresh. In addition, a row control circuit 16 delays the row enable signal RE and outputs the control signal CC.

Since the control signal CC is not generated in the case of a refresh, the column enable signal CE, generated from the control signal CC, is generated only in the cases of normal read and normal write, and not in the case of a refresh. Next, the column control circuit 14 further delays the control signal CC and outputs it as a column enable signal CE. Since the width of the one-shot pulse in the row enable signal RE determines the durations of the normal read, normal write, and refresh, the pulse width is set so as to be sufficient for these operations.

A boost power source 15 is a power source which supplies a boost potential, to be applied to a word line inside the memory cell array 6, to the row decoder 7. A substrate voltage generation circuit 16 is a circuit for generating a substrate voltage, to be applied to the well or the semiconductor substrate where the memory cells which form the memory cell array 6 are provided. Furthermore, a reference voltage generation circuit 17 generates a reference voltage (e.g. (½) $V_{DD}$) to be used by the memory cell array 6, the sense amplifiers in the sense amplifier/reset circuit 9, and the precharge circuit and equalize circuit.

A power down control signal PowerDown is supplied to the refresh control circuit 4, the boost power source 15, the substrate voltage generation circuit 16, and the reference voltage generation circuit 17. The power down control signal PowerDown is a signal for specifying from outside the semiconductor memory device the mode when the semiconductor memory device is set to power down state (standby state). The refresh control circuit 4, the power boost source 15, the substrate voltage generation circuit 16, and the reference voltage generation circuit 17 control their own power supplies in compliance with the power down control signal PowerDown.

In this embodiment, since the memory cell itself is the same as in a DRAM, power supply to circuits in the semiconductor memory device cannot easily be terminated in standby state as in an SRAM. Even in standby state, in order to preserve the data of the memory cell, power must be continuously supplied to the circuits required for the refresh operation. That is, the semiconductor memory device of this embodiment is not completely interchangeable with the SRAM with respect to standby state. Nevertheless, this embodiment provides some of the modes in standby state so as to maximize its interchangeability with the SRAM, and in addition, provides modes which do not exist in existing semiconductor memory devices.

In this embodiment, three types of standby mode are available, in accordance with which of the refresh control circuit 4, the power boost source 15, the substrate voltage generation circuit 16, and the reference voltage generation circuit 17, is to be operated. In the specification of this application, these standby modes will be termed standby modes 1 to 3 for sake of convenience. Standby mode 1 is a mode for supplying power to all four types of circuit, standby mode 2 is a mode for stopping power to the refresh control circuit 4 of the four types of circuit and supplying power to the other three types, and standby mode 3 is a mode for stopping the power supply to all four types of circuit.

The circuit which supplies the power down control signal PowerDown comprises, for example, a first power supply line for supplying power to the refresh control circuit 4, and a second power supply line for supplying power to the boost power source 15, the substrate voltage generation circuit 16, and the reference voltage generation circuit 17.

Subsequently, the standby modes will be explained in greater detail. Standby mode 1 is a power supply mode equivalent to a general DRAM, and has the largest consumed current of the three standby modes. However, in this case, power is supplied to all the circuits required in refreshing the memory cell. Consequently, for reasons such as the data of the memory cell immediately prior to shifting to the standby state is being held, the time taken from switching the semiconductor memory device from standby state to active state is the shortest among the three types of standby mode. To set the standby mode 1, power should be supplied to both the first power supply line and the second power supply line.

On the other hand, in standby mode 2, power is not supplied to the circuits required for refreshing. Therefore, although data of the memory cell cannot be held in standby state, the consumed current can be reduced to less than that in standby mode 1. That is, standby mode 2 reverses the existing concept of holding data in the standby state, and assumes that, after shifting from standby state to active state, the state need only be one wherein it is possible to write in the entire memory cell array. In other words, the data of the memory cell at the time of switching to standby state is not held at the return to active state. Consequently, standby mode 2 and standby mode 3 explained below are suitable for cases such as when the semiconductor memory device is used as a buffer. To set the standby mode 2, the power supply to the refresh control circuit 4 is stopped without supplying power to the first power supply line.

In standby mode 3, the boost voltage, substrate voltage, and reference voltage, must be raised, and consequently, the time taken to shift from standby state to active state is the longest of the three standby modes; however, the consumed current in standby mode is the smallest of the three standby modes. To set the standby mode 3, the power supply to the refresh control circuit 4, the boost power source 15, the substrate voltage generation circuit 16, and the reference voltage generation circuit 17, is stopped without supplying power to the first power supply line and the second power supply line.

In any of the standby modes 1 to 3, regarding the circuits other than the four types of circuits mentioned above, power should be supplied only to the required circuits. For example, when only performing a refresh, the address buffer 1, the input filter 19, the latch 2, the ATD circuit 3, the column decoder 8, the I/O buffer 10, the R/W control circuit 11, the latch control circuit 12, the column control circuit 14, and the like, are not used, and therefore their power supplies may be stopped.

By providing standby modes as described above, it is possible to precisely control the necessity of storing data in standby state, the return time to active state, current consumption, and the like, in accordance with the equipment which the semiconductor memory device is applied in, its environment of use, and the like, from outside the semiconductor memory device. The power down control signal PowerDown is not an essential function and may be omitted, thereby making the general-purpose SRAM completely interchangeable with the I/O pin.

Explanation of Operations (Normal Read)

An operation of the semiconductor memory device according to the constitution described above will be explained by following the timing chart shown in FIG. 2.

Firstly, when time t1 is reached, the value of the address "Address" starts to change from "$A_{n-1}$" to "An", and in addition, an unillustrated chip select signal/CS becomes valid. Since there are skews between the bits of the address "Address" and the chip select signal/CS, not all the bits of the address "Address" are not always determined at this point, as in the general-purpose SRAM.

Consequently, the latch control circuit 12 outputs the latch control signal LC at "L". At this point, since change in the address "Address" must be speedily transmitted to the sections of the semiconductor memory device, the latch control circuit 12 also outputs the input sensitivity control signal IC at "L". Therefore, the address "Address" is buffered by the address buffer 1, passes through the input filter 19 and the latch 2, and is supplied as an internal address L_ADD to the ATD circuit 3, the multiplexer 5, and the column decoder 8.

Then, at time t2, the ATD circuit 3 detects the change in the address "Address" (=internal address L_ADD) and generates a positive one-shot pulse as the address transition detect signal ATD. When the address transition detect signal ATD rises, the multiplexer 5 selects the refresh address R_ADD side and outputs it as the address M_ADD. In accordance with the rise of the address transition detect signal ATD, the row control circuit 13 generates a positive one-shot pulse as the row enable signal RE.

The row decoder 7 detects the rise of the row enable signal RE and decodes the value of the address M_ADD, and, at time t3, activates a word line corresponding to the refresh address R_ADD (hereinafter the word line to be refreshed will be termed "refresh word line"). In order to simplify FIG. 2, the voltage waveform of the refresh word line and the voltage waveform of the word line activated at normal reading or normal writing are shown together as "Word". However, the refresh word lines in the memory cycles are generally different from the word lines activated by normal reading or normal writing.

Then, when time $T_{SKEW}$ has elapsed from time t1 where the address "Address" started to change, the value of all the bits of the address "Address" are determined at time t4, reaching a state where it is possible to capture the value of the address "Address" in the latch 2. Then, at time t5, the ATD circuit 3 lowers the positive one-shot pulse generated in the address transition detect signal ATD. The latch circuit 12 generates a positive one-shot pulse as the input sensitivity control signal IC at time t6 using the fall of the address transition detect signal ATD as a trigger.

When the input sensitivity control signal IC rises to "H", the input filter 19 lowers the sensitivity toward the address output from the address buffer 1, thereby functioning as a noise filter. Consequently, even when system noise from the outside or internally generated power source noise superimposes on the address "Address", an address from which the noise has been cancelled or reduced is supplied to the latch 2. At this point, since the address "Address" has been determined and there is no longer any need to speedily transmit change in the address "Address" to the sections in semiconductor memory device, no problem is caused by reducing the sensitivity to the addresses output from the address buffer 1.

Thereafter, from time t7, the row control circuit 13 generates a positive one-shot pulse as the sense amplifier enable signal SE. As a result, the sense amplifier/reset circuit 9 activates internal sense amplifiers, starting a refresh of the memory cells connected to the refresh word line corresponding to the refresh address R_ADD. In this way, in the present embodiment, the standby period during which the value of the address "Address" supplied from the outside has not been determined (skew period $T_{SKEW}$) is used for the refresh, making effective use of the standby period of a general-purpose SRAM where internal operations are not carried out. Incidentally, in the refresh operation it is not necessary to output the read data to the outside as in normal reading. Therefore, the control signal CC and the column enable signal CE remain at "L", and the column decoder 8 does not generate a column select signal.

Then, as shown in FIG. 2, around the time t7, power source noise is generated by the activation of the sense amplifiers, and power source noise is superposed on the address output from the address buffer 1. However, the operation of the input filter 19 cancels or reduces the noise on the address supplied to the latch 2, so that the value of the address "Address" returns to its original value as supplied from the outside. Thereafter, when the row control circuit 13 lowers the row enable signal RE after a period of time required for the refresh operation has elapsed, the row decoder 7 deactivates the refresh word line at time t8.

Then, the row control circuit 13 receives the fall of the row enable signal RE and lowers the sense amplifier enable signal SE, and the sense amplifier/reset circuit 9 deactivates the internal sense amplifiers which were active. Furthermore, the row control circuit 13 receives the fall of the row enable signal RE and generates a positive one-shot pulse as the precharge enable signal PE. Consequently, the precharge circuit in the sense amplifier/reset circuit 9 prepares for the next access and performs a precharge operation.

At time t10, in response to the fall of the address transition detect signal ATD at time t5, the refresh control circuit 4 updates the refresh address R_ADD in preparation for the refresh to be performed subsequently. Furthermore, the latch control circuit 12 receives the fall of the address transition detect signal ATD at time t5, and generates a positive one-shot pulse as the latch control signal LC. As a result, the latch 2 latches the address output from the input filter 19. At this time, at time t9 immediately prior to time t10, system noise from the outside superimposes on the address output from the address buffer 1. However, since the input filter 19 filters this system noise, the latch 2 is able to latch the value "An" of correct address which noise has been cancelled or reduced from.

Provided that the latch 2 has correctly latched the address, there will be no malfunction in subsequent operations, even when noise superimposes on addresses output from the address buffer 1. Accordingly, to enable address changes in the next memory cycle (from time t18, explained below) to be transmitted speedily from the address buffer 1 to the latch 2, the latch control circuit 12 lowers the input sensitivity control signal IC at a suitable timing (time t12 in FIG. 2).

Then, normal reading or normal writing following the refresh is performed from time t11. FIG. 2 shows the case of normal reading, where the frequency of noise generated inside the chip is high, and normal reading will be explained here. In the case of normal reading, an unillustrated output enable signal OE becomes valid, whereby the R/W control circuit 11 switches the control signal CWO to "H" in preparation for reading from the memory cell. Consequently, the I/O buffer 10 is able to transmit read data, sent from the sense amplifier/reset circuit 9, via the bus WRB to the bus I/O.

Furthermore, the multiplexer 5 selects the internal address L_ADD, and, since the value of the address "Address" is determined at this point, its value An (more precisely, the row address portion) is output to the row decoder 7 as the address M_ADD. Subsequently, in response to the fall of the address transition detect signal ATD, the row control circuit 13 generates a positive one-shot pulse as the row enable signal RE. As a result, the row decoder 7 activates the word line corresponding to the value "An" of the address M_ADD (hereinafter, the word line to be read will in some cases be termed "read word line") at time t11. Consequently, the data stored in the memory cells connected to the read word line subsequently appears as a potential on the respective bit lines.

On the other hand, in response the rise of the row enable signal RE, the row control circuit 13 generates a positive one-shot pulse as the sense amplifier enable signal SE at time t13. As a consequence, the sense amplifier/reset circuit 9 activates its internal sense amplifiers, sensing the data in the memory cells read on each of the individual bit lines, and amplifies it to an "0"/"1" logical level.

At this time, the activation of the sense amplifier causes power source noise in the output of the address buffer 1, in the same way as at time t7. However, in this case, since the latch 2 has already latched the address, there is no danger of noise superimposing on the address output from the address buffer 1 being passed through the input filter 19 and supplied to the latch 2.

Subsequently, when the row control circuit 13 generates a positive one-shot pulse as the control signal CC, the column control circuit 14 generates a positive one-shot pulse as the column enable signal CE. When the column enable signal CE rises to "H", the column decoder 8 decodes the column address portion contained in the value "An" of the internal address L_ADD, and generates a positive one-shot pulse as the column select signal corresponding to this column address.

As a result, the sense amplifier/reset circuit 9 selects the output of the sense amplifier corresponding to the column address and connects to the bus WRB, whereby data held in the read memory cell appears on the bus WRB. Consequently, the I/O buffer 10 outputs the read data on the bus WRB to the bus I/O at time t14, and the data output operation commences from this point. The data output operation generates power source noise, the effects of which cause noise to superimpose on the output of the address buffer 1. However, in this case, since the latch control signal LC is "H" and the latch 2 has latched the address, the operation is not disrupted by the address appearing noise being supplied to circuits positioned at later stages than the latch 2.

When the reading from the memory cell array 6 ends and the row control circuit 13 lowers the row enable signal RE, the row decoder 7 deactivates the read word line, which was activated for normal reading, at time t16. In accordance with the fall of the row enable signal RE, the row control circuit 13 lowers the sense amplifier enable signal SE and the sense operation ends. Moreover, when the row control circuit 13 lowers the control signal CC in accordance with the fall of the row enable signal RE, the column control circuit 14 lower the column enable signal CE.

Consequently, the column decoder 8 invalidates the column select signal, and disconnects the connection between the selected sense amplifier and the bus WRB. Then, in accordance with the fall of the row enable signal RE, the row control circuit 13 generates a positive one-shot pulse as the precharge enable signal PE, and a precharge operation is performed. The read data output operation is completed at time t15, and the effects of power source noise caused by this operation are eliminated.

Accordingly, the latch control circuit 12 lowers the latch control signal LC at time t17 and cancels the latch state of the latch 2. As a consequence, change in the address "Address" in the next memory cell is speedily transmitted via the address buffer 1, the input filter 19, and the latch 2, to sections of the semiconductor memory device. Thereafter, the operation enters the next memory cycle at time t18 and the address "Address" starts to change; when the access request is read, an operation similar to that of times t1 to t18 is carried out.

Explanation of Operations (Other than Normal Read)

The operation when performing normal write after a refresh is basically the same as normal read. As in the general-purpose SRAM, in the MSRAM, the write enable signal/WE and the write data are applied asynchronously with respect to the address "Address". Therefore, when a negative pulse is input as the write enable signal/WE, the R/W control circuit 11 lowers the control signal CWO and starts an operation to capture write data on the bus I/O, input from the I/O buffer 10, into the bus WRB.

When the sense amplifier is finally activated by the same process as in the case of normal reading, data is written from the bus WRB to the specified memory cell. Then, the write data is determined at the point when the write enable signal/WE is raised, and writing ends. In this way, since normal writing has no data output operation as in normal reading, no power source noise is generated at the timing corresponding to time t14 in FIG. 2. Therefore, the case of normal reading may be considered as a countermeasure against noise on the address.

In the above explanation, refresh is always carried out in accordance with accesses from the outside, but actually, refreshes are not carried out in all memory cycles. Furthermore, when refreshes are performed intermittently, for example, one refresh cycle may comprise several ms to several tens of ms, with one refresh being performed every several μs. Then, in memory cycles where no refresh is required, the refresh control circuit 4 changes the refresh control signal REFA to "L" with the refresh control signal REFB still at "H". As a consequence, the row control circuit 13 does not generate the row enable signal RE, and the corresponding sense amplifier enable signal SE and precharge enable signal PE, and normal reading or normal writing is carried out without a refresh. That is, power source noise is no longer generated at the timing corresponding to time t7 in FIG. 2. Therefore, the case of normal reading after a refresh may be considered as a countermeasure against noise on the address.

Incidentally, when accesses from the outside are not performed at fixed times, a self-refresh is performed by generating a negative one-shot pulse as the refresh control signal REFB. In this case, the latch control circuit 12 does not generate a one-shot pulse as the latch control signal LC, and there is no malfunction due to latching an incorrect address.

In this embodiment, a page mode, used in general-purpose DRAMs and the like, can be realized in the same manner as in the first relevant invention. In page mode, the address "Address" applied from the outside is logically divided into an upper bit side address "UAddress" and a lower bit side address "PageAddress". Then, the data is continuously input or output to multiple memory cells having the same address "UAddress" while sequentially changing only the address "PageAddress".

To realize this, when, for example, four memory cells are being accessed continuously, the width of the bus WRB is enlarged fourfold, and the sense amplifiers in the sense amplifier/reset circuit 9 are accordingly configured to simultaneously select four bit lines. Furthermore, a bus selector is provided between the sense amplifier/reset circuit 9 and the I/O buffer 10, and selectively inputs and outputs one of the simultaneously read data in compliance with the address "PageAddress".

In normal reading in page mode, for example, data of four memory cells are simultaneously read from the memory cell array 6, and are thereafter sequentially output to the outside in compliance with the address "PageAddress", applied from the outside. Therefore, in realizing page mode, after the output operation of the final data of, for example, four data, the latch control signal LC must be lowered.

There is burst mode that is similar to page mode. In page mode, the address "PageAddress" can be specified at random from the outside. In contrast, in burst mode, a lower address "StartAddress" is applied at the start of the burst operation instead of the address "PageAddress". Then, the second and subsequent lower addresses are generated inside the semiconductor memory device in compliance with a predetermined sequence. Therefore, in burst mode, as in page mode, the latch control signal LC must be lowered after the output operation of the final data.

Summary

As described above, in this embodiment, after the address skew period has elapsed and the address "Address" has been determined (at time t4), the input filter 19 lower the sensitivity toward the address at a predetermined time (time t6) before the time where the latch 2 latches this address (time t10). Consequently, even when system noise input from the outside and power source noise caused by activating the sense amplifier are generated during times t4 to t10, these noises on the address buffer 1 are cancelled or reduced, with the result that the latch 2 does not latch an incorrect address.

Furthermore, by securing the period shown by ② in FIG. 2, even when system noise from the outside, power source noise caused by activating the sense amplifier during normal reading or normal writing, and power source noise caused by the data output operation during normal reading, are generated in the period while the latch 2 is latching the address, the address appearing the noise is not transmitted to circuit positioned at later stages than the latch 2. Therefore, it is possible to completely prevent malfunctions caused by noise.

Modifications

The timing of raising the latch control signal LC and capturing the address in the latch 2 may logically be simultaneous to the determination of the address. However, due to variations in manufacture and reasons relating to the system, there will be cases where the timing of the determination of the address is delayed. Therefore, preferably, a margin for the address skew period is allowed in manufacturing, and the latch timing is set and the latch operation is performed after all the bits of the address "Address" have been certainly transmitted to each of the individual latch circuits which comprise the latch 2.

When the latch timing of the address is delayed, there is an equivalent delay in the completion of normal reading or normal writing. Accordingly, after the end of the refresh operation, the address should be latched in the latch 2 until a new word line can be activated for normal reading/normal writing. Furthermore, in FIG. 2, the input sensitivity control signal IC is lowered at time t12, but need only be lowered after time t10, when the address is captured by the latch 2, and may be lowered at an earlier time than time t12.

Moreover, there may be cases where the effects of system noise from the outside present little problem. In such cases, instead of reducing sensitivity toward the address by using the input filter 19, the latch control signal LC may be raised at a timing when there are no effects of power source noise caused by the activation of the sense amplifiers during the refresh (i.e. a timing prior to activating the sense amplifier, or a timing after the effects of the power source noise caused by amplification of the sense amplifier have ended).

Simulation Results

Figure 6:
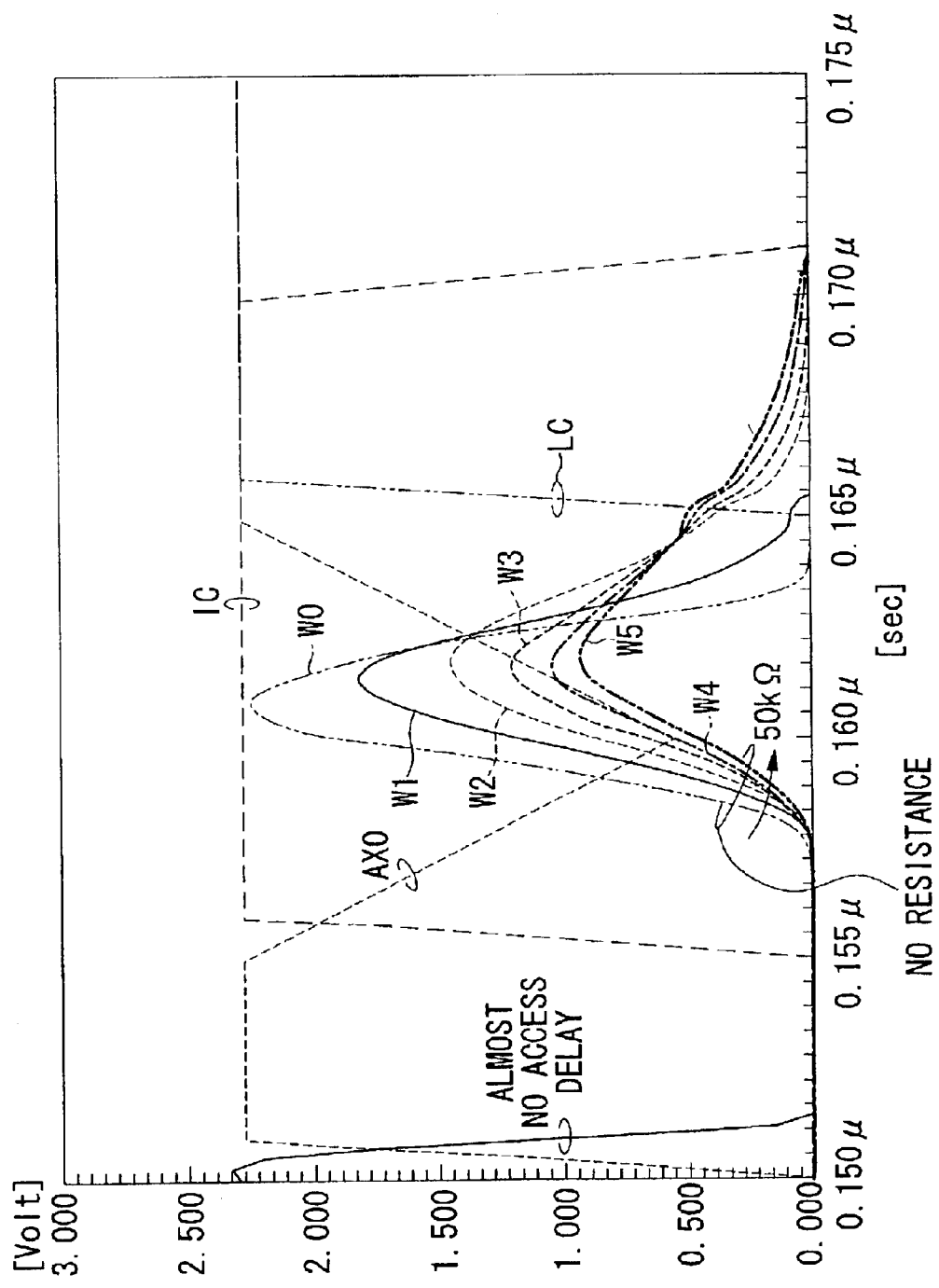
FIG. 6 is a graph showing an output waveform obtained when the value of a resistance element has been changed in the case where an address appearing noise has been input to the input filter shown in FIG. 3, in comparison with an output waveform obtained when there is no resistance element, and shows the case where one bit of the address has been changed from "0" to "1"
Figure 7:
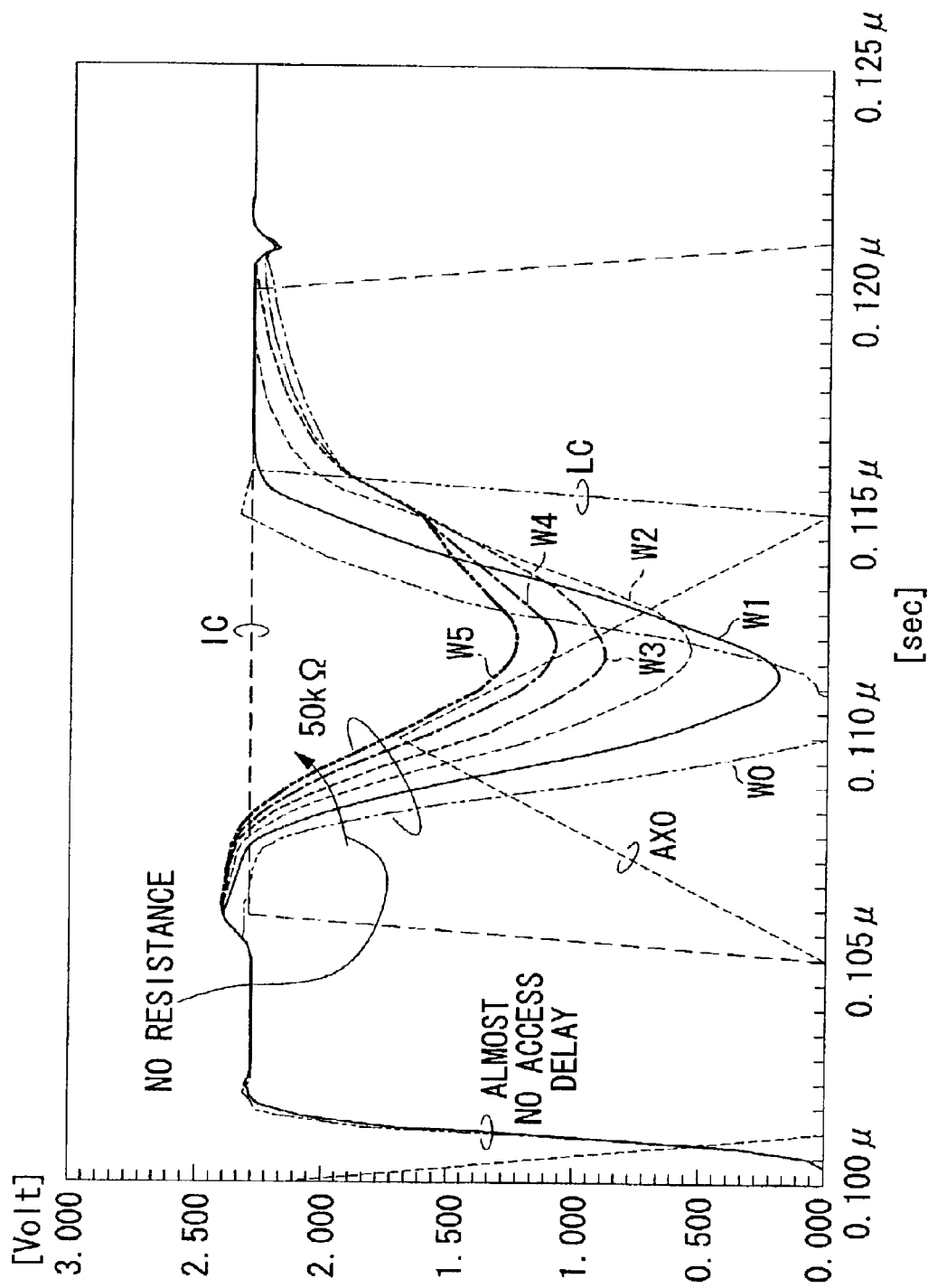
FIG. 7 is a graph showing an output waveform obtained when the value of a resistance element has been changed in the case where an address appearing noise has been input to the input filter shown in FIG. 3, in comparison with an output waveform obtained when there is no resistance element, and shows the case where one bit of the address has been changed from "1" to "0"

FIG. 6 and FIG. 7 are graphs showing simulated waveforms of each section when the constitution example shown in FIG. 3 was used as the input filter 19. In FIGS. 6 and 7, the horizontal axes represent relative time (in units of seconds) and the vertical axes represent voltage values (in units of volts) of the waveforms. In these diagrams, W0 represents the waveform input to the latch circuit 23 in a case where the input filter 22 of FIG. 3 is not provided (a conventional semiconductor memory device).

Furthermore, W1 to W5 respectively represent waveforms input to the latch circuit 23 when the resistance value of the resistance element 26 shown in FIG. 3 is changed from 10 kΩ to 50 kΩ at intervals of 10 kΩ. Since the address buffer 21 is an inverting buffer as shown in FIG. 3, the polarity of the waveform of a bit ("AX0" in the diagrams) of the address "Address" and the polarities of the waveforms W0 to W5 are reversed.

Firstly, FIG. 6 shows the case where, after the value of the address AX0 has shifted from "0" B (B being a binary expression) to "1" B, the effects of noise cause the voltage value of the address AX0 to fall linearly from 2.3 V to 0.6 V from times 0.155 to 0.160 μs, and rise linearly from 0.6 V to 2.3 V from times 0.160 to 0.165 μs. In FIG. 6, during the period from times 0.156 to 0.170 μs, the input sensitivity control signal IC changes to "H" and the input filter 22 reduces sensitivity; in addition, the latch control signal LC rises from time 0.165 μs and the latch circuit 23 starts its capturing operation.

As shown in FIG. 6, in the case of waveform W0, the peak voltage value reaches a value near the maximum amplitude as a result of the noise on the address AX0, whereby the latch circuit 23 identifies the address, which would be at "L" if there were no noise, as "H". As the resistance value of the resistance element 26 increases, the waveform input to the latch 2 is smoothed and its peak voltage value decreases. Consequently, when the threshold voltage of the latch circuit 23 is, for example, 1.25 V, increasing the resistance value to 30 kΩ or more ensures that the latch circuit 23 identifies the address as "L".

Furthermore, with regard to the waveform from times 0.150 to 0.152 μs in FIG. 6, when the address AX0 starts to change from "0" B to "1" B, the input sensitivity control signal IC is "L", and therefore the address buffer 21 and the input filter 22 supply the address AX0 to the latch circuit 23 with almost no delay; at this point, change in the address "Address" is speedily transmitted to the latch circuit 23 and the circuits positioned at later stages than the latch circuit 23.

FIG. 7 shows the case where the value of the address AX0 has shifted from "1" B to "0" B. As shown in FIG. 7, the effects of noise cause the voltage value of the address AX0 to rise linearly from 0 V to 1.7 V from times 0.105 to 0.110 μs, and fall linearly from 1.7 V to 0 V from times 0.110 to 0.115 μs. In FIG. 7, during the period from times 0.105 to 0.120 μs, the input sensitivity control signal IC changes to "H", and the latch control signal LC rises from time 0.115 μs.

Similarly in this case, at waveform W0, the dip voltage value supplied to the latch circuit 23 is approximately 0 V, and the latch circuit 23 identifies the address AX0, which would be at "H" if there were no noise, as "L". As the resistance value of the resistance element 26 increases, the waveform is smoothed and its dip voltage increases. Consequently, when the threshold voltage of the latch circuit 23 is, for example, 1.25 V, setting the resistance value to 50 kΩ ensures that the latch circuit 23 identifies the address as "H". Furthermore, with regard to the waveform from times 0.100 to 0.102 μs, the address buffer 21 and the input filter 22 transmit a change in the address AX0 to the latch circuit 23 with almost no delay.

Embodiment 2

The first embodiment is based on the first relevant invention mentioned above, but the present inventors have proposed an MSRAM of another aspect differing from the first relevant invention (Japanese Patent Application (Unpublished) No. 2000-109689; hereinafter termed "second relevant invention"). This invention can be applied not only in the first relevant invention but approximately similarly in the second relevant invention; this embodiment is based on the second relevant invention, and the following explanation concentrates on the points of difference with the first relevant invention.

As already explained, in the first embodiment, normal reading or normal writing is performed after the refresh, but in this embodiment, the sequence of the first embodiment is altered so that normal reading or late writing (explained in detail below) is performed prior to the refresh. This achieves a faster access time than that of the first embodiment (address access time $T_{AA}$ in the case of reading).

In a general-purpose SRAM, the write enable signal is applied asynchronous to the address, but in this embodiment, the write enable signal is applied during the address skew period for the following reasons. To increase the reading speed, reading must start as soon as possible after the address skew period has elapsed. To achieve this, when applying the write enable signal asynchronous to the address, unless the write enable signal can be applied during the address skew period, it is impossible to know which of write/read is to be performed at the end of the address skew period. Accordingly, a read operation is begun in order to speed up the reading, but, when the access applied from the outside was a request for writing, the write enable signal becomes valid after a delay. Consequently, the read operation which was begun after the address skew period had elapsed becomes a dummy read, and the intended write operation must be carried out after this read operation.

Since the MSRAM reads from the memory cells by destructive reading in the same manner as a DRAM, data are destroyed when a dummy read is terminated. That is, in the MSRAM, even when the write enable signal is applied, the write operation cannot begin until the dummy reading is complete. Consequently, if the specifications are such that the write enable signal is applied completely asynchronous to the address, there is a problem that the memory cycle becomes longer. For these reasons, by determining whether the address from the outside is a request for reading or writing during the address skew period, writing can begin as soon as the address is determined without first having to perform a dummy read.

Furthermore, in this embodiment, writing to the memory cell is carried out by late writing. In late writing, in the memory cycle during which a write request has been applied from the outside, write data and a write address, also applied from the outside, are captured in the semiconductor memory device. Thereafter, in the memory cycle during which the next write request is applied, data is written to the memory cell using the write address and write data which were captured in the previous memory cycle. In other words, late writing involves delaying the writing to the memory cell until the memory cycle during which the next write request is applied.

In normal writing, the write enable signal is applied asynchronous to the address, as in the general-purpose SRAM, and consequently there is a drawback that the writing operation to the memory cell does not start until the write enable signal and the write data have both been determined, creating a period of blank time. On the other hand, in late writing, the write address and write data are determined from the start in the memory cycle where writing is actually to be carried out, making it possible to begin writing as soon as the address skew period has elapsed. In this embodiment, late writing enables the operation of capturing the write data, which is input later than the address, to be performed in parallel with late writing and the refresh operation which follows the late writing, whereby the memory cycle can be shortened.

As described above, in this embodiment, normal reading or late writing start immediately after the address skew period has elapsed and the address "Address" has been determined. In this embodiment, two noise countermeasures are provided, as in the first embodiment. Firstly, when there is a possibility of malfunctions due to noise, the period during which the sensitivity of the input filter 19 is reduced is placed after the address skew period, canceling or reducing noise before performing normal reading or late writing.

Access is delayed by the period of canceling or reducing the noise, but this countermeasure is effective as long as the access delay is not so considerable as to cause breakdown. Furthermore, the peak value of the noise varies according to the individual specifications of the semiconductor memory device and the system which it is used in. Therefore, assuming that the peak value of the noise is not very high, the period of reducing the sensitivity of the input filter 19 should be made as short as possible, to shorten the access delay.

When a delay in access is not desirable, a second countermeasure of extending the end of the latch state without providing a period for reducing the sensitivity of the input filter 19 may be considered. That is, in determining whether or not to provide the period for reducing the sensitivity of the input filter 19, a trade-off is made between the possibility of malfunctions due to noise on the address and the access delay caused by reducing the sensitivity of the input filter 19.

The countermeasure of extending the fall timing of the latch control signal LC can be applied in approximately the same manner as in the first embodiment. In this embodiment, since refresh is performed after normal read and late write, the latch control signal LC is raised before the normal reading or late writing; in addition, the latch control signal LC falls after the sense amplifier enable signal SE rises during the refresh. Consequently, it is possible to reduce the effects of power source noise generated by the activation of the sense amplifier during normal reading and refresh, and power source noise accompanying a data output operation during normal reading. Furthermore, the effects of system noise from the outside can disappear during the period of raising the latch control signal LC.

Explanation of the Constitution

Figure 8:
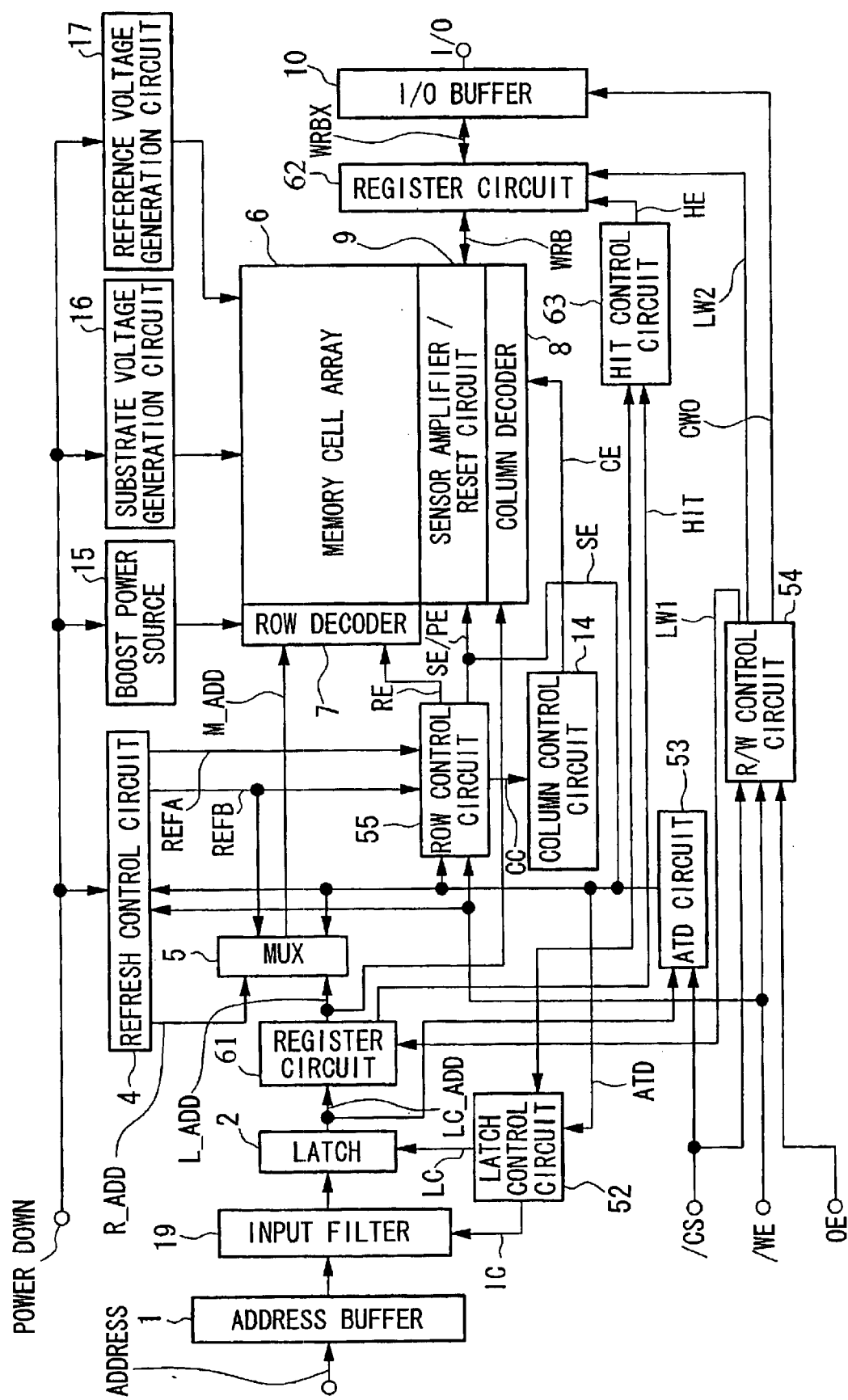
FIG. 8 is a block diagram showing the constitution of the semiconductor memory device according to a second embodiment of the present invention.

FIG. 8 is a block diagram showing the constitution of the semiconductor memory device according to this embodiment. In FIG. 8, the same constituent elements as those shown in FIG. 1 (first embodiment) are represented by the same reference numerals, and the following explanation will concentrate on the points of difference with FIG. 1. Firstly, in this embodiment, the address output from the latch 2 is termed an internal address LC_ADD, and the output from a register circuit 61 (explained later) is termed internal address L_ADD. In this embodiment, the sense amplifier/reset circuit 9 and the I/O buffer 10 are not connected directly at the bus WRB, but are connected via the bus WRB, the register circuit 62 explained later, and a bus WRBX.

Control signal LW1 and control signal LW2 are signals for controlling the late write operation, both being set at "H" when performing late writing, and otherwise set at "L". The register circuit 61 contains a register (hereinafter "address register") which is equal to the bit width of the address "Address" for holding an access address. When the control signal LW1 is at "L", the register circuit 61 outputs the input internal address LC_ADD unaltered as internal address L_ADD.

On the other hand, when the control signal LW1 is at "H", the register circuit 61 outputs the address held in the address register, not the internal address LC_ADD, as the internal address L_ADD. Further, at the falling edge of the control signal LW1, the register circuit 61 captures the internal address LC_ADD for the next late write in its address register. Moreover, the register circuit 61 comprises a comparator which compares each bit of the input internal address LC_ADD and the address held in the address register. When all the bits of each address match, the comparator outputs a hit signal HIT at "H", and, when even one bit of each address does not match, outputs the hit signal HIT at "L".

As will be explained below, the hit signal HIT is used in a bypass operation for maintaining data coherency as seen from the semiconductor memory device. In late writing, data is actually written to the memory cell in a later memory cycle than that which the write request was made in. Therefore, in the memory cycle which the write request was made in, write address and write data are momentarily captured in the address register of the register circuit 61 and a data register inside a register circuit 62 (explained below).

Then, in the memory cycle which the write request was input in, data is written to the memory cell array 6 by using the address and data captured in the two registers. Therefore, when a read request is made for the address which the write request has been made for before the actual writing to the memory cell array 6, this data has not yet been written to the memory cell array 6 and exists only in the register circuit 62. For this reason, when data is read from the memory cell array 6, old data prior to writing will be output to the outside and a malfunction will occur.

In such a case, the data is output from the register circuit 62 while bypassing the memory cell array 6. To detect the above circumstances, the internal address LC_ADD and the address register are consulted, detecting the fact that a read request has been made for an address which has not yet been written in the memory cell array 6. The register circuit 61 generates the hit signal HIT without distinguishing between reading and writing, but this poses no problem since the bypass operation, explained below, is carried out only when a read request has been made.

A latch control circuit 52 has the same constitution as the latch control circuit 12 of FIG. 1, but generates the latch control signal LC and the input sensitivity control signal IC at different timings. The timings of these signals will be covered in the operations explanation. An ATD circuit 53 has the same constitution as the ATD circuit 3 of FIG. 1, but differs from the ATD circuit 3 in that the timing of generating the one-shot pulse as the address transition detect signal ATD comes after the address skew period has elapsed. As explained below, normal reading or late writing from/to the address "Address" starts at the rise of the one-shot pulse in the address transition detect signal ATD, and the refresh starts at the fall of the one-shot pulse. Consequently, the pulse width of the one-shot pulse is set equal to or greater than the time required to complete normal reading and late writing.

The length of the address skew period should either match the maximum value of the skew between the bits of the address "Address" and the chip select signal/CS, or should be slightly greater than the maximum value of the skew in order to offer some margin. The maximum skew value can be estimated in advance based on the characteristics of the overall system which the semiconductor memory device is applied in. Therefore, the address skew period can be made variable in accordance with the system which the semiconductor memory device is applied in, or alternatively, the system which the semiconductor memory device is applied in can be designed in correspondence with a predetermined address skew period.

Subsequently, the register circuit 62 and the hit control circuit 63 realize the late write operation together with the above-mentioned register circuit 61. The hit control circuit 63 captures the hit signal HIT at the rise of the address transition detect signal ATD, and transmits it as a hit enable signal HE to the register circuit 62. That is, since the value of the address "Address" is not determined within the address skew period, the hit control circuit 63 captures the hit signal HIT when the address "Address" is determined. The hit enable signal HE is used only in the read operation, and this is controlled by the register circuit 62; so that the hit control circuit 63 generates the hit enable signal HE irrespective of whether the access request is for writing or reading.

The register circuit 62 contains a data register having the same bit width as the data transmitted/received through the bus WRB. Using the fall edge of the control signal LW2 as a trigger, the register circuit 62 captures write data, supplied from the outside to the bus WRBX via a bus I/O and the I/O buffer 10, in its data register. That is, when there has been a write request, the write data applied in that memory cycle is momentarily captured in the data register, and, in the memory cycle containing the next write request, the write data which has been captured in the data register is written into the memory cell array 6.

When the control signal LW2 is "H", the register circuit 62 outputs the write data, applied at the time of the immediately preceding write request, from its data register onto the bus WRB. On the other hand, when the control signal LW2 is "L", the register circuit 62 performs different operations in accordance with the level of the hit enable signal HE. When the hit enable signal HE is "L" representing a miss-hit, the register circuit 62 outputs the read data on the bus WRB unaltered to the bus WRBX. In contrast, when the hit enable signal HE is "H" representing a hit, the register circuit 62 transmits write data, which is not yet written in the memory cell array 6, from its data register to the bus WRBX.

A R/W control circuit 54 differs from the R/W control circuit 11 of FIG. 1 in that, in addition to the control signal CWO, it also generates control signals LW1 and LW2. A row control circuit 55 differs from the row control circuit 13 of FIG. 1 in respect of the following points. At the first write request after the activation of the semiconductor memory device, no preceding write exists. Therefore, in the memory cycle which the write request was made in, only the capturing of the write address and write data is carried out, and no late writing is performed to the memory cell array 6. To accomplish this, a flag is provided inside the row control circuit 55, and this flag stores whether the write enable signal/WE has been made valid even once while the chip select signal/CS is valid.

The row control circuit 55 initializes the flag to OFF at the time of the activation of the semiconductor memory device, and switches the flag ON when the first write request is made. When the write request has been made (when the write enable signal/WE="L" and the chip select signal/CS= "L"), the row control circuit 55 generates a one-shot pulse as the row enable signal RE only when the flag is ON. As a result, the row control circuit 55 and the column control circuit 14 generate the control signal CC, the sense amplifier enable signal SE, the column enable signal CE, and the precharge enable signal PE, which are needed to perform writing.

Explanation of Operations (Normal Read)

Next, the operation of the semiconductor memory device according to this embodiment will be explained with reference to the timing chart of FIG. 9. With regard to noise on an address, it is preferable to deal with the explanation of normal read, and therefore, the late write operation will be explained later. Here it is assumed that there has been a write request for data "Qx" at the address "Ax" in a memory cycle prior to that shown in FIG. 9, the address "Ax" having been captured in the address register of the register circuit 61, and the data "Qx" having been captured in the data register of the register circuit 62. Moreover, the chip select signal/CS is fixed at "L", selecting the semiconductor memory device shown in FIG. 8.

Firstly, at time t31, the value of the address "Address" starts to change from "$A_{n-1}$". At this point, as in the first embodiment, the input sensitivity control signal IC and the latch control signal LC are both "L" and the control signal LW1 is "L". Therefore, the address "Address" passes through the address buffer 1, the input filter 19, and the latch 2, and becomes the internal address LC_ADD; the internal address LC_ADD passes through the register circuit 61 and becomes the internal address L_ADD.

Then, the ATD circuit 53 detects that the address "Address" has started to change from the change in the internal address LC_ADD. Since the address skew period begins from time t31, the value of the address "Address" will not necessarily be determined at this point, as in the general-purpose SRAM. Therefore, the latch 2 does not capture the address "Address" at time t31; instead, the address "Address" is captured when the value of the address "Address" has been determined as "An" after time $T_{SKEW}$ has elapsed. An output enable signal OE becomes valid during the address skew period, though this is not illustrated in FIG. 9.

Then, the R/W control circuit 54 changes the control signal CWO to "H" in preparation for reading from the memory cell, while keeping the control signals LW1 and LW2 at "L". Consequently, the I/O buffer 10 transmits the data on the bus WRBX to the bus I/O. Since this point is still within the address skew period, and the hit enable signal HE is still in the state of the preceding memory cycle, it is not determined whether data on the data WRB are to be read to the bus WRBX, or data held in the data register are to be read.

Next, when the address skew period ends at time t32, the value of the address "Address" (i.e. the internal address LC_ADD) is determined as "An". At this time, since the control signal LW1 is "L", the value of the internal address LC_ADD is output unaltered as the internal address L_ADD. Furthermore, since the value "An" of the internal address LC_ADD does not match the address "Ax" held in the address register, the register circuit 61 outputs "L" as the hit signal HIT.

At time t33, the ATD circuit 53 generates a positive one-shot pulse as the address transition detect signal ATD, starting the normal read operation. Then, the refresh control circuit 4 updates the value of the refresh address R_ADD.

The multiplexer 5 selects the internal address L_ADD and outputs it to the row decoder 7 as an address M_ADD. Moreover, the hit control circuit 63 captures the hit signal HIT and outputs "L" as the hit enable signal HE. As a consequence, the register circuit 62 connects the bus WRB and the bus WRBX, enabling the sense result of the sense amplifiers in the sense amplifier/reset circuit 9 to be output via the I/O buffer 10 and the bus I/O to the outside.

Thereafter, change in the address "Address" is propagated to respective sections, and the latch control circuit 52 generates a positive one-shot pulse as the input sensitivity control signal IC at time t34. As a result, the input filter 19 reduces its sensitivity toward the input address. Consequently, even when system noise from the outside superimposes on the output of the address buffer 1 at, for example, time t35, which is a timing immediately prior to the capturing of the address by the latch 2, address from which noise has been cancelled or reduced is supplied to the latch 2. Therefore, when the latch control circuit 52 subsequently raises the latch control signal LC at time t36 and the latch 2 captures the address, the incorrect address appearing noise will not be captured.

Thereafter, the latch control circuit 52 lowers the input sensitivity control signal IC at time t37. When the row control circuit 55 generates a positive one-shot pulse in the row enable signal RE, at time t38, the row decoder 7 activates the read word line which corresponds to the address "An". At time t39, when the row control circuit 55 raises the sense amplifier enable signal SE, the activation of the sense amplifier generates power source noise in the chip. However, since the latch 2 has latched the address, no address appearing noise is transmitted to circuits positioned at later stages than the latch 2 and no malfunction is caused.

Subsequently, when the row control circuit 55 generates a positive one-shot pulse as the control signal CC, the column control circuit 14 generates a positive one-shot pulse as the column enable signal CE. Consequently, the column decoder 8 activates the column select signal corresponding to the column address contained in the address "An", and connects the corresponding sense amplifiers to the bus WRB. Then, the sense amplifiers sense and amplify the data in the memory cells connected to the read word line, and outputs this data from the bus I/O via the bus WRB, the register circuit 62, the bus WRBX, and the I/O buffer 10, to the outside. This data output operation generates power source noise at time t40, but, as at time t39, no address appearing noise is propagated to circuits positioned at later stages than the latch 2 and no malfunction occurs.

Thereafter, in order to complete normal reading, the row control circuit 55 lowers the row enable signal RE to deactivate the read word line at time t41, then lowers the sense amplifier enable signal SE and ends the sensing operation. The column control circuit 14 lowers the column enable signal CE and disconnects the connection between the sense amplifiers and the bus WRB. Next, the row control circuit 55 generates a one-shot pulse as the precharge enable signal PE and precharges the bit line.

When the ATD circuit 53 lowers the address transition detect signal ATD at time t42, a refresh accompanying normal reading is carried out by the same operation as in the first embodiment. As a result, the refresh word line is activated at time t43, and the row control circuit 55 generates a positive one-shot pulse as the sense amplifier enable signal SE at time t44, thereby activating the sense amplifiers and generating power source noise as the refresh begins. However, since the address is latched in the latch 2 at this point, no address appearing noise is propagated to circuits positioned at later stages than the latch 2 and no malfunction occurs.

When the refresh operation reaches time t45, the memory cycle which normal reading has been performed in ends, and the operation shifts to the next new memory cycle, the refresh operation being completed by the end of the address skew period of this new memory cycle. At time t46, the refresh word line is deactivated, and at time t47, the latch control signal LC is lowered. While the address "Address" is undetermined, the address transition detect signal ATD will not rise to start normal reading or late writing, and the internal address L_ADD is held at its value in the preceding memory cycle; therefore, no problem arises even when the refresh extends until the end of the address skew period of the next memory cycle.

Explanation of Operations (Late Writing)

Since the late write operation is largely similar to normal reading, this explanation will center on the points of difference with normal reading. The word line which is to be written will be termed "write word line". In the first write after the activation of the semiconductor memory device, nothing is written in the memory cell array 6, but the write data and write address applied from the outside are captured in the data register and address register respectively.

The operation when there has been a second or subsequent write request is as follows. A negative pulse is input as the write enable signal/WE during the address skew period. In response to the fall of the write enable signal/WE, the R/W control circuit 54 changes the control signal CWO to "L" and the control signals LW1 and LW2 to "H". As a result, the I/O buffer 10 transmits the write data in the bus I/O to the bus WRBX. At this point, the write data may not necessarily be determined. The register circuit 61 outputs the address "Ax" held in the address register as an internal address L_ADD, and the register circuit 62 outputs the data "Qx" held in the data register to the bus WRB.

Then, when the address skew period has elapsed and the address has been determined, it is also determined which of write and read is to be performed. At this time, the write address and write data are already determined in the memory cycle which the write request was made immediately before. Therefore, the write operation starts after the input filter 19 has reduced sensitivity toward the address from a fixed time prior to latching the address.

To achieve this, the sense amplifiers are selected, as in normal reading, and the writing of the data "Qx" to the memory cells specified by the address "Ax" starts. When the writing to the memory cell array 6 ends, the row enable signal RE, the write word line, the sense amplifier enable signal SE, the column enable signal CE, and the column select signal, are deactivated as in normal reading, and the bit line is precharged in preparation for the next access.

A refresh is performed after the late writing, and the write data to the address "An" (data "Qn" in this case) is determined before the write enable signal/WE rises during the refresh, and is transmitted via the bus I/O and the I/O buffer 10 to the bus WRBX. The bus WRBX is not connected to the bus WRB at this time, and the data "Qn" has no relationship with the writing to the memory cell array 6. In response to the rise of the write enable signal/WE, the R/W control circuit 54 lowers the control signals LW1 and LW2.

In response to the fall of the control signal LW1, the register circuit 61 captures the value "An" of the internal address LC_ADD into the address register, and, in response to the fall of the control signal LW2, the register circuit 62 captures the data "Qn" from the bus WRBX into the data register. The address "An" and the data "Qn" are used in late writing in the memory cycle when the next write request is made. As described above, since late writing has no data output operation as in normal reading, no power source noise is generated. Therefore, the case of normal reading should be considered with regard to noise on the address.

Explanation of Operations (Other)

Subsequently, the bypass operation will be explained. For example, let us suppose that writing and reading at the address "An" are performed in consecutive memory cycles. In this case, in the memory cycle which the write request was made in, the write data "Qn" to be applied to the address "An" is not yet reflected in the memory cell array 6. In the read memory cycle, when the address skew period elapses and the value of the address "Address" is determined as "An", at this point the address register is holding an "An" which is the same as the address "Address" (=internal address LC_ADD).

Therefore, the register circuit 61 outputs the hit signal HIT at "H". Thereafter, when the input sensitivity control signal IC falls, the hit control circuit 63 captures the hit signal HIT and outputs the hit enable signal HE at "H". At this time, since the R/W control circuit 54 is outputting the control signal LW2 at "L", the register circuit 62 outputs the data "Qn" held in the data register to the bus WRBX, passing it through the I/O buffer 10 to the outside.

As is clear from the explanation above, the noise countermeasures of the bypass operation may be regarded as identical to those of the normal read operation.

Figure 9:
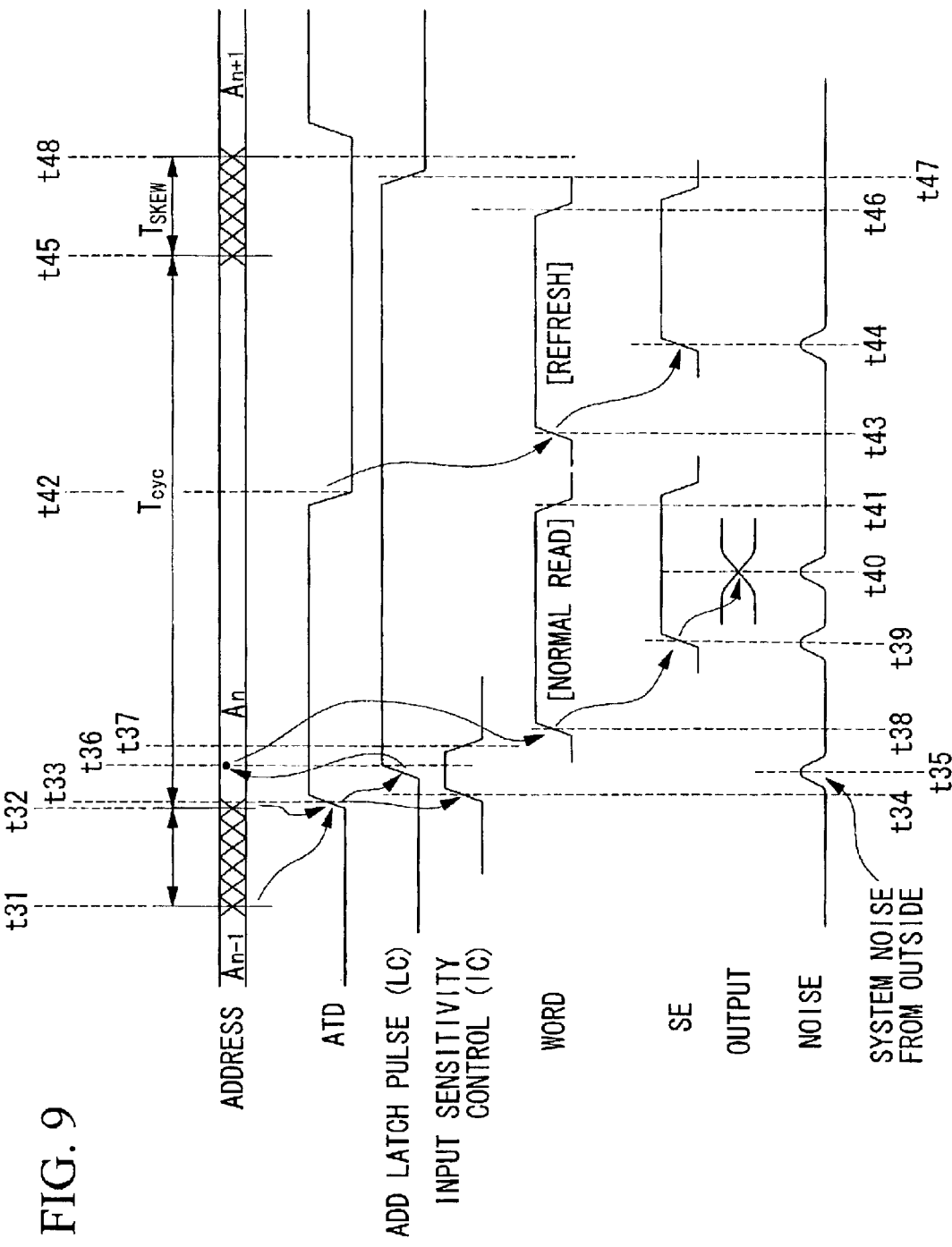
FIG. 9 is a timing chart showing an operation of the semiconductor memory device according to the same embodiment.

When no refresh is performed along with normal reading or late writing, the operation is the same as described in the first embodiment; for example, power source noise is no longer generated at time t44 shown in FIG. 9. Therefore, the refresh case should be considered with regard to the noise on an address. In the case of a self-refresh, as in the first embodiment, no one-shot pulse is generated as the latch control signal LC, and consequently, there is no danger of latching an incorrect address.

In the above explanation, one refresh accompanies the write or read operation, but when one memory cycle is made longer, multiple refreshes can be performed within that single memory cycle. Therefore, the timing of the fall of the latch control signal LC should be made later than the final refresh in one memory cycle. By determining the write data during the address skew period in addition to the write enable signal/WE, it is possible to perform a normal write, instead of a late write, in the memory cycle which the write request has been made in. Here, late writing is merely replaced by normal writing, and the noise countermeasures are those of the normal read described above.

In this embodiment, page mode and burst mode can be applied in the same way as in the first embodiment. In the second embodiment, normal read or late write is performed before the refresh. For this reason, in the case of normal reading, after multiple data have been simultaneously read from the memory cell array 6, no access is made to the memory cell array 6, which remains empty. Therefore, the operation of sequentially outputting the multiple data to the outside can be performed in parallel with the refresh operation accompanying normal reading. Consequently, the latch control signal LC is lowered in correspondence with whichever is later of the timings of activating the sense amplifier during refresh and outputting the final data of the multiple data read in normal reading.

In this embodiment, the input sensitivity control signal IC is lowered at time t37 in FIG. 9, but may be lowered earlier than time t37 provided that it is after the time t36 when the latch 2 captures the address.

The embodiments described above center on an MSRAM, but this invention is not limited to this and may be applied in various semiconductor memory devices such as a general-purpose DRAM, a general-purpose SRAM, and a pseudo-SRAM; the application is not limited to a RAM, and may be a ROM (read only memory) instead.

In the semiconductor memory device according to the embodiments described above, for example, the entire circuit shown in FIG. 1 may be of course mounted on a single chip, or the entire circuit may be split into several function blocks, each of which is mounted on a chip. One example of the latter is a hybrid IC (integrated circuit) wherein the control section, which generates various types of control signals and address signals (e.g. a circuit comprising all or part of the circuits excluding the memory cell array 6, and at least comprising the input filter 19 and the latch 2, the sense amplifier/reset circuit 9, which is a source of noise, and the I/O buffer 10), and the memory cell section are mounted on separate chips (control chip and memory chip). In other words, this invention can be arranged in a constitution where various types of control signals are supplied to the memory chip from a control chip, provided outside the memory chip.

Industrial Application

This invention realizes a semiconductor memory device wherein, when power source noise is generated by activation of a sense amplifier and by a data output operation inside the chip, or when system noise is generated from outside the chip, an incorrect address appearing the noise is not captured so as to lead to malfunction. This invention can usefully be applied in a semiconductor memory device capable of continuously refreshing and writing or reading within one memory cycle.

What is claimed is:

1. An input circuit which latches an input address signal at a predetermined timing, comprising:

an input filter circuit which reduces noise sensitivity with respect to the input address signal from the determination of the input address signal until at least the predetermined timing, and a timing setting circuit that controls a latch timing according to effects of noise on the input address signal;

wherein the input address signal is latched after passing through the input filter circuit.

2. An input circuit which latches an input address signal at a predetermined timing comprising:

an input filter circuit which reduces noise sensitivity with respect to the input address signal from the determination of the input address signal until at least the predetermined timing, wherein the input address signal is latched after passing through the input filter circuit and, wherein the length of the period where the input filter circuit reduces the noise sensitivity is the length needed for the input address signal on which noise is superimposed to return to a level at which the input address signal will not be identified as an incorrect address while the noise sensitivity is reduced.

3. An input circuit which latches an input address signal at a predetermined timing, comprising:

an input filter circuit which reduces noise sensitivity with respect to the input address signal from the determination of the input address signal until at least the predetermined timing; and a sense circuit which senses data stored in memory cells, wherein the input address signal is latched after passing through the input filter circuit and, wherein the input filter circuit starts to reduce the noise sensitivity with respect to the input address signal prior to the timing of activating the sense circuit.

4. An input circuit which latches an input address signal at a predetermined timing, comprising:

an input filter circuit which reduces noise sensitivity with respect to the input address signal from the determination of the input address signal until at least the predetermined timing, wherein the input address signal is latched after passing through the input filter circuit; and, wherein the input filter circuit includes:

a resistance element which smoothens the waveform of the input address signal by the effect with a parasitic capacitance; and a switch circuit which outputs the input address signal via the resistance element during the period where the noise sensitivity with respect to the input address signal is reduced, and outputs the input address signal without passing through the resistance element other than the period.

5. An input circuit which latches an input address signal at a predetermined timing, comprising:

an input filter circuit which reduces noise sensitivity with respect to the input address signal from the determination of the input address signal until at least the predetermined timing, wherein the input address signal is latched after passing through the input filter circuit, and, wherein the input filter circuit has hysteresis characteristics in which a threshold value is changed in accordance with a mode of change in the level of the input address signal.

6. An input circuit which supplies a first address signal to a predetermined circuit, which operates in response to the first address signal, comprising:

a latch circuit which latches an input address signal for a predetermined period and outputs the first address signal to the predetermined circuit;

a timing setting circuit which cancels the latch state of the latch circuit after a timing at which noise can be generated inside a chip; and a sense circuit which senses data stored in memory cells, wherein the timing setting circuit cancels the latch state of the latch circuit after a timing of activating the sense circuit in the final refresh of a predetermined number of consecutive refreshes of the memory cells.

7. The input circuit as described in claims 1 or 6, further comprising:

a detection circuit which generates an address transition detect signal in response to a latched input address signal; and a latch signal generating circuit which generates a latch signal for specifying latch timing in response to the address transition detect signal.

8. The input circuit as described in claim 7, wherein the detection circuit generates the address transition detect signal in response to the latched input address signal or an activation signal, which becomes valid at the time of accessing memory cells by using the latched input address signal.

9. The input circuit as described in claim 1 or 6, further comprising: a circuit which controls such that a refresh to memory cells and reading or writing from and to the memory cells are performed within a period of one memory cycle in a memory cycle which the refresh is performed in.

10. A semiconductor memory device, comprising:

the input circuit as described in any one of claims 1, 2 to 5, and 6; and a circuit comprising at least memory cells, which operates in response to the latched input address signal output from the input circuit.

11. The semiconductor memory device as described in claim 10, wherein the input circuit comprising:

a detection circuit which generates an address transition detect signal in response to the latched input address signal; and a latch signal generating circuit which generates a latch signal for specifying latch timing in response to the address transition detect signal.

12. The semiconductor memory device as described in claim 11, wherein the detection circuit generates the address transition detect signal in response to the latched input address signal or an activation signal, which becomes valid at the time of accessing memory cells by using the latched input address signal.

13. The semiconductor memory device as described in claim 10, wherein the input circuit further comprising: a circuit which controls such that a refresh of memory cells and reading or writing from and to the memory cells are performed within a period of one memory cycle in a memory cycle which the refresh is performed in.

14. An input circuit which latches an input address signal at a predetermined timing, comprising:

a timing setting circuit which cancels the latch state after a timing at which noise can be generated inside a chip; and a sense circuit which senses data stored in memory cells, wherein the timing setting circuit cancels the latch state after a timing of activating the sense circuit during a refresh of the memory cells.

15. The input circuit as described in claims 6 or 14, further comprising an input filter circuit which reduces noise sensitivity with respect to the input address signal from the determination of the input address signal, and ends the operation of reducing noise sensitivity before a timing of activating the sense circuit, wherein the input address signal is latched after passing through the input filter circuit.

16. An input circuit which latches an input address signal at a predetermined timing, comprising:

an input filter circuit which reduces noise sensitivity with respect to the input address signal from the determination of the input address signal until at least the predetermined timing, wherein the input circuit latches the input address signal, which has passed through the input filter circuit, at the predetermined timing after the end of a refresh of memory cells, started in response to a change in the input address signal.

17. An input circuit which latches an input address signal at a predetermined timing, comprising:

an input filter circuit which reduces noise sensitivity with respect to the input address signal during a predetermined period before a timing of activating a sense circuit, which senses data stored in memory cells, by means of a refresh, wherein the input circuit latches the input address signal, which has passed through the input filter circuit.

* * * * *